US007595537B2

(12) United States Patent
Kodama et al.

(10) Patent No.: US 7,595,537 B2
(45) Date of Patent: Sep. 29, 2009

(54) MOS TYPE SEMICONDUCTOR DEVICE HAVING ELECTROSTATIC DISCHARGE PROTECTION ARRANGEMENT

(75) Inventors: Noriyuki Kodama, Kanagawa (JP); Hitoshi Irino, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 416 days.

(21) Appl. No.: 11/150,181

(22) Filed: Jun. 13, 2005

(65) Prior Publication Data

US 2005/0275032 A1    Dec. 15, 2005

(30) Foreign Application Priority Data

Jun. 14, 2004    (JP)    ............... 2004-176237

(51) Int. Cl.
*H01L 23/62* (2006.01)
(52) U.S. Cl. .............. 257/409; 257/355; 257/356; 257/360; 257/401; 257/E29.012
(58) Field of Classification Search ........... 257/355, 257/356, 360, 401, 409, E29.012
See application file for complete search history.

(56) References Cited

U.S. PATENT DOCUMENTS

| 6,399,990 | B1 * | 6/2002 | Brennan et al. | ............. 257/355 |
| 6,538,291 | B1 * | 3/2003 | Ohoka | ............. 257/363 |
| 6,690,067 | B2 * | 2/2004 | Ker et al. | ............. 257/355 |
| 6,815,775 | B2 * | 11/2004 | Ker et al. | ............. 257/355 |
| 6,841,825 | B2 * | 1/2005 | Kurosaki et al. | ............. 257/330 |
| 6,979,869 | B2 * | 12/2005 | Chen et al. | ............. 257/356 |
| 2002/0084491 | A1 * | 7/2002 | Lee et al. | ............. 257/355 |
| 2003/0202307 | A1 * | 10/2003 | Hung et al. | ............. 361/100 |

FOREIGN PATENT DOCUMENTS

JP    11-274404    10/1999

OTHER PUBLICATIONS

Tiziana Cavioni et al., "Latch-Up Characterization in Standard and Twin-Tub Test Structures by Electrical Measurements, 2-D Simulations and IR Microscopy", Proc. IEEE 1990 Int. Conference on Microelectronic Test Structures, vol. 3, Mar. 1990, pp. 41-46.

(Continued)

*Primary Examiner*—Eugene Lee
(74) *Attorney, Agent, or Firm*—McGinn IP Law Group, PLLC

(57) ABSTRACT

In a semiconductor device, a well region is formed in a semiconductor substrate, a transistor-formation region is defined in the well region. An electrostatic discharge protection device is produced in the transistor-formation region, and features a multi-finger structure including a plurality of fingers. A guard-ring is formed in the well region so as to surround the transistor-formation region, and a well blocking region is formed in the well region between the transistor-formation area and the guard-ring. A substrate resistance determination system is associated with the electrostatic discharge protection device to determine a substrate resistance distribution at the transistor-formation area such that snapbacks occur in all the fingers in a chain-reaction manner, and such that occurrence of a latch-up state is suppressed.

20 Claims, 17 Drawing Sheets

OTHER PUBLICATIONS

Yoon J. Huh, et al., "The Effects of Substrate Coupling on Triggering Uniformity and ESD Failure Threshold of Fully Silicided NMOS Transistors", VLSI Technology Digest of Technical Papers 2002 Symposium, pp. 11-13, Jun. 2002.

Scott Liao, et al., "New Observance and Analysis of Various Guard-Ring Structures On Latch-Up Hardness by Backside Photo Emission Image", Reliability Symposium Proceedings, 2003 41st Annual, 2003 IEEE International, Mar. 30-Apr. 4, 2003, pp. 92-98.

Tung-Yang Chen et al., "Analysis on the Dependence of Layout Parameters on ESD Robustness of CMOS Devices for Manufacturing in Deep-Submicron CMOS Process", IEEE Transactions on Semiconductor Manufacturing, vol. 16, No. 3, Aug. 2003, pp. 486-500.

* cited by examiner

MOS TYPE SEMICONDUCTOR DEVICE HAVING ELECTROSTATIC DISCHARGE PROTECTION ARRANGEMENT

BACKGROUND OF THE INVENTION

1. Field of the Invention

The present invention relates to a MOS (metal oxide semiconductor) type semiconductor device having an ESD (electrostatic discharge) protection arrangement, which is constituted such that an internal circuit of the MOS type semiconductor device is protected from damage caused by ESD phenomena, and more particularly, to an improvement of such an ESD protection arrangement including a plurality of MOS transistors.

2. Description of the Related Art

In order to protect an internal circuit of a MOS type semiconductor device from damage caused by ESD phenomena, an ESD protection arrangement is provided in the MOS type semiconductor device.

As discussed in detail hereinafter, the provision of the ESD protection arrangement involves both an uneven snapback-occurrence problem and a latch-up problem, and these problems must be solved before the ESD protection arrangement can be properly operated. However, it is difficult to simultaneously solve both the uneven snapback-occurrence problem and the latch-up problem because there is a tradeoff relationship therebetween.

For example, in JP-A-H11-274404 disclosing a MOS type semiconductor device having an ESD protection arrangement, although a solution of the uneven snapback-occurrence problem is discussed, there is no reference to occurrence of the latch-up problem.

SUMMARY OF THE INVENTION

Therefore, an object of the present invention is to provide a MOS type semiconductor device having an electrostatic discharge (ESD) protection arrangement, which is constituted such that both a uneven snapback-occurrence problem and a latch-up problem can be simultaneously solved.

In accordance with the present invention, there is provided a semiconductor device comprising a semiconductor substrate, a well region formed in the semiconductor substrate, a transistor-formation region defined in the well region, and an electrostatic discharge protection device produced in the transistor-formation region and featuring a multi-finger structure including a plurality of fingers. The respective fingers include elongated gate electrodes that are arranged in parallel to each other, and a plurality of first regions exhibiting a first conductivity type and a plurality of second regions exhibiting a first conductivity type are alternately arranged with respect to the elongated gate electrodes. The semiconductor device further comprises a guard-ring formed in the well region so as to surround the transistor-formation region, a well blocking region formed in the well region between the transistor-formation area and the guard-ring, and a substrate resistance determination system, which is associated with the electrostatic discharge protection device to determine a substrate resistance distribution at the transistor-formation area such that snapbacks occur in all the fingers in a chain-reaction manner, and such as occurrence of a latch-up state is suppressed.

When the well region exhibits a first conductivity type, the well blocking region may exhibit the same conductivity type as the well region. Optionally, the well blocking region may be defined as a high resistance region exhibiting, a second conductivity type.

In a preferable embodiment, the transistor-formation area is formed as a rectangular area, and the well blocking region is configured such that a gap is defined beside a center of a side of the transistor-formation area which is perpendicular to an extensional direction of the elongated gate electrodes. In this case, the substrate resistance determination system includes the well blocking region defining the gap. Also, preferably, each of the first regions has a first silicide layer formed thereon, and each of the second regions has a second silicide layer formed thereon, with a silicide blocking region being defined in the second silicide layer.

In another preferable embodiment, the semiconductor device further comprises a shallow trench isolation layer that defines the transistor-formation region, and the well blocking region is provided beneath the shallow trench isolation layer. The shallow trench isolation layer has a gap which is formed therein above the gap of the well blocking region. In this case, the substrate resistance determination system further includes a protrusion extended from the guard-ring into the gap formed in the shallow trench isolation. Preferably, each of the first regions has a first silicide layer formed thereon, and each of the second regions has a second silicide layer formed thereon, with a silicide blocking region layer being defined in the second silicide layer.

In yet another preferable embodiment, a pair of well blocking regions are substituted for the well blocking region. In this case, the pair of well blocking regions are configured and arranged such that two gaps are defined beside centers of opposed sides of the transistor-formation area which are perpendicular to an extensional direction of the elongated gate electrodes, and the substrate resistance determination system includes the pair of well blocking regions defining the gaps. Preferably, a first well blocking region is defined in the well region beneath each of the first regions, and a second well blocking region is defined in the well region beneath each of the second regions.

In still yet another preferable embodiment, the semiconductor device further comprises a shallow trench isolation layer that defines the transistor-formation region, and the well blocking region is provided beneath the shallow trench isolation layer. In this case, the transistor-formation area is formed as a rectangular area, and the substrate resistance determination system includes two resistor layers formed on the shallow trench isolation layer above respective sides of the well blocking region which are close to the outermost fingers, each of the resistor layers is being connected to at least one region formed in the well region and exhibiting the first conductivity type, and being further connected to the guard-ring. Preferably, each of the first regions has a first silicide layer formed thereon, and each of the second regions has a second silicide layer formed thereon, a silicide blocking area being defined in the second silicide layer.

In still yet another preferable embodiment, a plurality of well blocking regions are substituted for the well blocking region. In this case, the plurality of well blocking regions are configured and arranged such that gaps are defined beside each of opposed sides of the transistor-formation area which are in parallel to an extensional direction of the elongated gate electrodes, and the substrate resistance determination system includes the plurality of well blocking regions defining the gaps. Preferably, a first well blocking region is defined in the well region beneath each of the first regions, and a second well blocking region is defined in the well region beneath each of the second regions. Alternatively, each of the first regions has a first silicide layer formed thereon, and each of the second regions has a second silicide layer formed thereon, with a silicide blocking region being defined in the second silicide layer.

In still yet another preferable embodiment, a pair of well blocking regions are substituted for the well blocking region. In this case, the pair of well blocking regions are arranged along opposed sides of the transistor-formation area which are perpendicular to an extensional direction of the elongated gate electrodes, and the substrate resistance determination system includes a plurality of first well blocking region defined in the well region beneath the first regions, and a plurality of second well blocking region defined in the well region beneath the second regions. Preferably, the guard-ring has two inner opposed sides which are close to opposed sides of the transistor-formation area which are in parallel to an extensional direction of the elongated gate electrodes.

In still yet another preferable embodiment, the substrate resistance determination system includes two elongated resistor layers arranged along respective opposed sides of the transistor-formation area which are perpendicular to an extensional direction of the elongated gate electrodes. In this case, each of the elongated gate electrodes is connected to one of the elongated resistor layers at one end thereof, and is connected to the other elongated resistor layer at the other end thereof, with the elongated resistor layers being connected to the guard-ring at their ends. Preferably, each of the first regions has a first silicide layer formed thereon, and each of the second regions has a second silicide layer formed thereon.

In still yet another preferable embodiment, the semiconductor device further comprises a shallow trench isolation layer that defines the transistor-formation regions and the well blocking region is provided beneath the shallow trench isolation layer. In this case, the transistor-formation area is formed as a rectangular area, and the substrate resistance determination system includes a resistor layer formed on the shallow trench isolation layer above a side of the well blocking region which is perpendicular to an extensional direction of the elongated gate electrodes, the resistor layer being connected to at least one region formed in the well region and exhibiting the first conductivity type, and being further connected to the guard-ring. Preferably, each of the first regions has a first silicide layer formed thereon, and each of the second regions has a second silicide layer formed thereon, a silicide blocking region being defined in the second silicide layer.

BRIEF DESCRIPTION OF THE DRAWINGS

The above object and other objects will be more clearly understood from the description set forth below, with reference to the accompanying drawings, wherein.

DESCRIPTION OF THE PREFERRED EMBODIMENTS

Before description of the preferred embodiments of the present invention, for better understanding of the present invention, prior art MOS (metal oxide semiconductor) type semiconductor devices having an electrostatic discharge (ESD) protection arrangement will be explained below.

Figure 1:
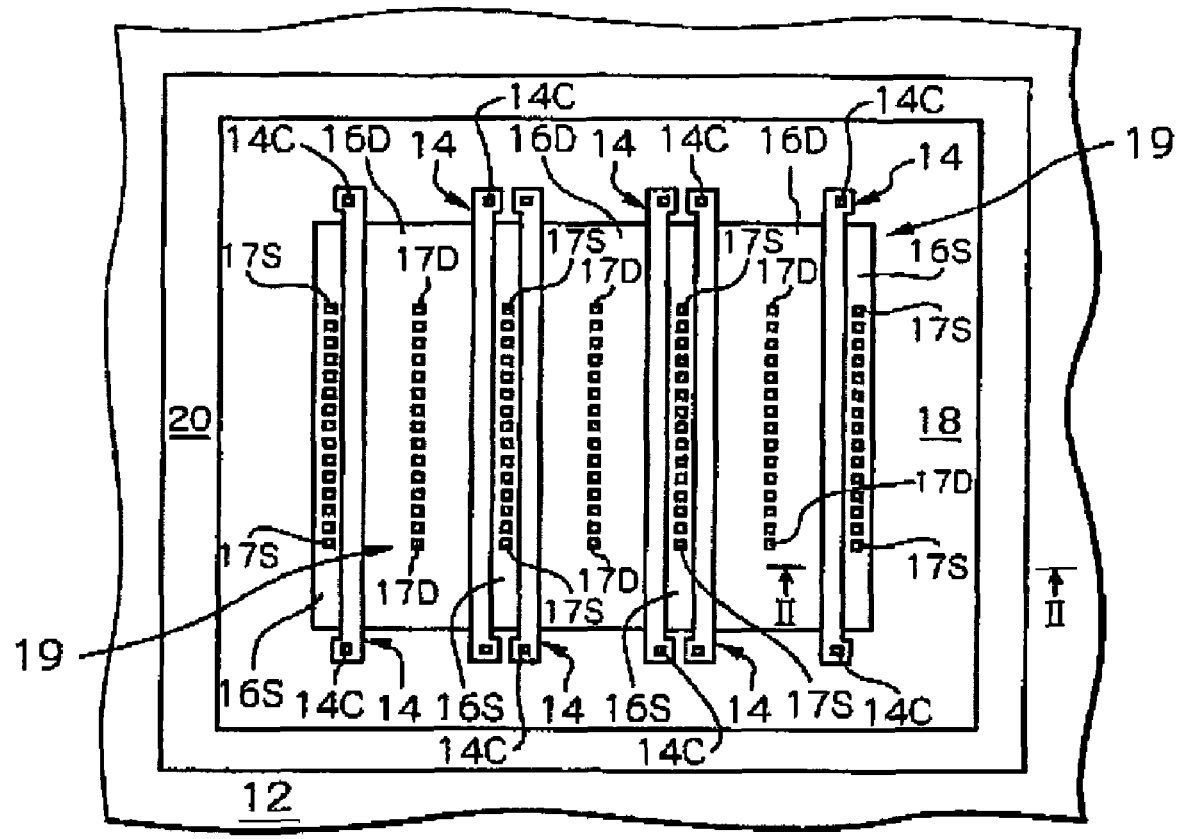
FIG. 1 is a plan view of a first prior art MOS type semiconductor device having an electrostatic discharge (ESD) protection arrangement.
Figure 2:
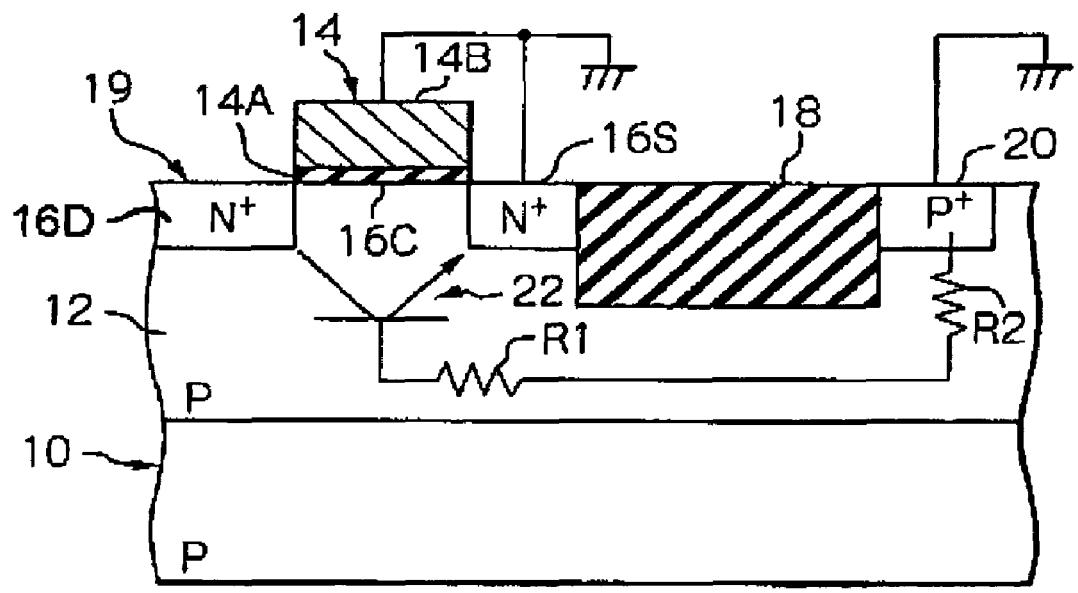
FIG. 2 is a partial cross-sectional view taken along the II-II line of FIG. 1.

FIGS. 1 and 2 illustrate a first prior art MOS type semiconductor device having an ESD protection arrangement.

As shown in FIG. 2, the first prior art MOS type semiconductor device includes a P-type semiconductor substrate 10, which is derived from, for example, a P-type silicon wafer, and a P-type well region 12 is formed in the P-type semiconductor substrate 10. This prior art MOS type semiconductor device features a multi-finger structure for effectively constituting the ESD protection arrangement.

In the multi-finger structure, a plurality of elongated gate electrodes 14 are formed on the P-type well region 12 so as to be arranged in parallel to each other. As shown in FIG. 2, each of the elongated gate electrodes 14 includes a gate insulating layer 14A formed as a silicon dioxide layer on the P-type well region 12, and a gate electrode layer 14B formed as a polycrystalline silicon layer on the gate insulating layer 14A.

Also, in the multi-finger structure, a plurality of $N^+$-type regions 16S and 16D are formed in the P-type well region 12 so as to be alternately arranged with respect to the elongated gate electrodes 14, as shown in FIG. 1. In this embodiment, the N-type impurity diffusion region 16S serves as a source region, and the $N^+$-type region 16D serves as a drain region, with a channel region 16C being defined between the source and drain regions 16S and 16D.

Although not shown in FIGS. 1 and 2, in reality, an insulating interlayer is formed on the surface of the P-type semiconductor substrate 10 including the P-type well region 12, to thereby cover the elongated gate electrodes 14, source regions 16S and drain regions 16D.

Contact plugs 17S are formed in the insulating interlayer above each of the source regions 16S so as to be in contact with the corresponding source region 16S, and are aligned with each other in an extensional direction of the elongated gate electrodes 14, as shown in FIG. 1. Similarly, contact plugs 17D are formed in the insulating interlayer above each of the drain regions 16D so as to be in contact with the corresponding drain region 16D, and are aligned with each other in the extensional direction of the elongated gate electrodes 14. Further, two contact plugs 14C are formed in the insulating interlayer above the ends of each of the elongated gate electrodes 14 so as to be in contact with the respective ends thereof.

In FIG. 1, reference 18 indicates a shallow trench isolation (STI) layer defining a transistor-formation area 19, at which the elongated gate electrodes 14, source regions 16S and drain regions 16D are produced and formed. Also, reference 20 indicates a $P^+$-type region which is produced and formed in the P-type well region 12 so as to surround the STI layer 18, and the $P^+$-type region 20 serves as a guard-ring.

In short, in the MOS type semiconductor device featuring the multi-finger structure shown in FIG. 1, one finger is defined by one of the elongated gate electrodes 14, and the source and drain regions 16S and 16D arranged along the respective sides of the elongated gate electrode 14, with a plurality of MOS transistors being produced and arranged in series along each of the elongated gate electrodes 14.

As representatively shown in FIG. 2, each of the is source region 16S is grounded through the intermediary of the contact plugs 17S (not visible in FIG. 2). Similarly, each of the elongated gate electrodes 14 is grounded through the intermediary of the contact plugs 14C (not visible in FIG. 2). Namely, each of the MOS transistors, which are arranged along each of the elongated gate electrodes 14, is defined as a diode-connected MOS transistor. Also, the $P^+$-type region or $P^+$-type guard-ring 20 is grounded through the intermediary of via plugs (not shown) formed in the insulating interlayer. Further, the drain region 16D is connected to electrode pads (not shown in FIGS. 1 and 2), which are formed on the insulating interlayer, through the intermediary of a via plug (not shown) formed therein.

Figure 3:
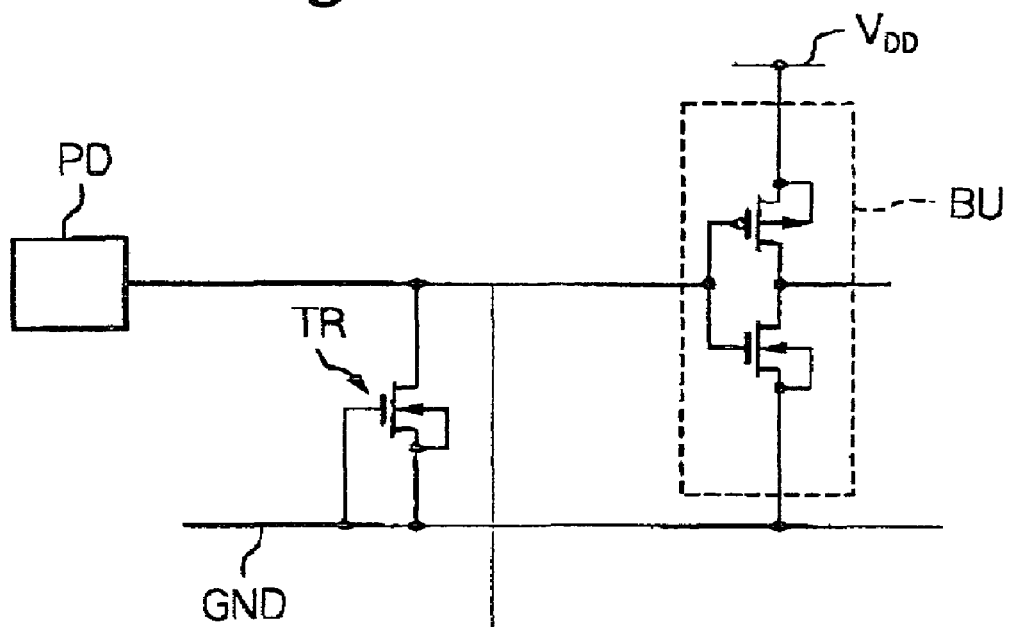
FIG. 3 is an equivalent circuit of the first prior art MOS type semiconductor device having the ESD protection arrangement.

FIG. 3 illustrates an equivalent circuit of the first prior art MOS type semiconductor device having the ESD protection arrangement.

In FIG. 3, reference TR representatively indicates one of the MOS transistors arranged along each of the elongated gate electrodes 14. Also, reference PD indicates an electrode pad formed on the aforesaid insulating interlayer. Further, reference BU indicates an input buffer which is formed as a complementary metal oxide semiconductor (CMOS) inverter formed in the P-type semiconductor substrate 10, and the CMOS inverter includes a P-channel MOS transistor and an N-channel MOS transistor associated with each other, as shown in FIG. 3.

As already stated with reference to FIG. 2, both the gate (14) and the source (16S) of the MOS transistor TR are grounded (GND), and the drain (16D) of the MOS transistor TR is connected to the electrode pad PD. Also, a common gate of the input buffer or CMOS inverter BU is connected to the electrode pad PD, and a common drain of the CMOS inverter BU is connected to an internal circuit (not shown) formed in the P-type semiconductor substrate 10. Further, in the input buffer or CMOS inverter BU, a source of the P-channel MOS transistor is wired so as to be supplied with a power supply voltage ($V_{DD}$), and a source of the N-channel MOS transistor is wired so as to be grounded (GND), as shown in FIG. 2.

When a negative ESD current flows into the ground (GMD) through the electrode pad PD and the diode-connected MOS transistor TR exhibiting a relatively low resistance, whereby the internal circuit can be protected from damage which may be caused by the negative surge current.

On the other hand, when a positive ESD current flows into the MOS transistor TR through the electrode pad PD, the MOS transistor TR functions as a parasitic NPN type bipolar transistor 22, as symbolically shown in FIG. 2, in which the source region 16S serves an emitter, the drain region 16D serves as a collector, and the P-type semiconductor substrate 10 including the P-type well region 12 and the guard-ring 20 serves as a base. Note, in FIG. 2, references R1 and R2 represent a substrate resistance of the P-type semiconductor substrate 10 including the P-type well region 12. Namely, by carrying out an operation of the parasitic NPN type bipolar transistor 22, it is possible to protect the internal circuit from damage which may be caused by the positive surge current.

Figure 4:
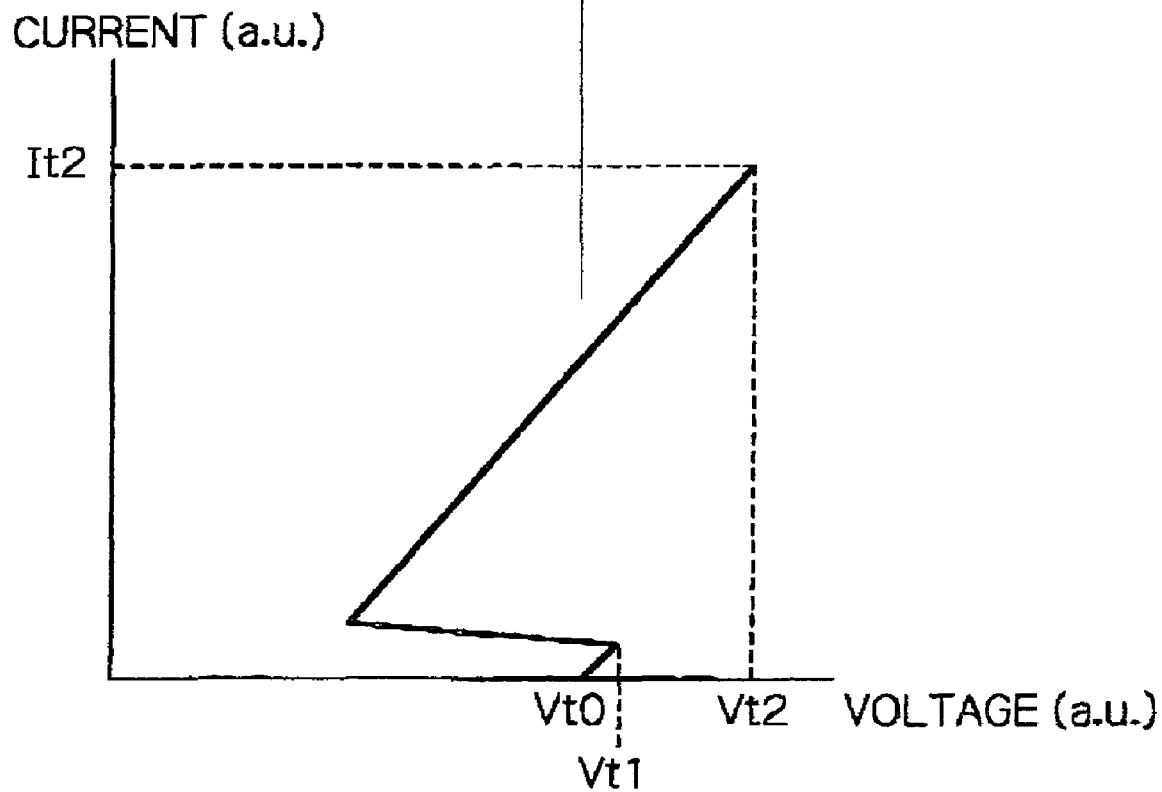
FIG. 4 is a graph showing a current/voltage characteristic of the first prior art MOS type semiconductor device having the ESD protection arrangement when having with a positive surge current as an ESD current applied thereto.

In particular, while the surge current flows into the drain region 16D is supplied with the positive surge current through the intermediary of the electrode pad PD, the MOS transistor TR exhibits a current/voltage characteristic or I-V curve as shown in a graph of FIG. 4. Namely, a drain voltage is risen rises at the drain region 16D, due to the surge current flowing into supplement of the drain region 16D with the positive surge current, and an avalanche breakdown occurs at a PN junction between the drain region 16D and the channel region 16C when the drain voltage exceeds a predetermined threshold voltage $V_{t0}$ (FIG. 4) to thereby produce electrons and holes in pairs at the PN junction. The electrons are absorbed in the drain region 16D. On the other hand, the holes flow as a substrate current into the P-type semiconductor substrate 10 including the P-type well region 12, and finally reach the guard-ring 20.

The substrate current causes a potential difference in the P-type semiconductor substrate 10 including the P-type well region 12, with the potential difference corresponding to a product of the substrate current and the resistance of the P-type semiconductor substrate 10, and thus a potential rises in the vicinity of the bottom of the source region 16S with respect to the guard-ring 20. When the potential rises to a voltage (e.g. 0.7 volts) at which the PN junction between the drain region 16D and the channel region 16C is forwardly biased, i.e. when the drain voltage has reached a voltage $V_{t1}$ (FIG. 4), the parasitic bipolar transistor 22 is turned ON, so that a low resistance state is produced between the drain region 16D and the source region 16S. This phenomena is called a snapback, and the voltage $V_{t1}$ is called a trigger voltage. In short, a source-drain resistance is considerably decreased so that a large amount of surge current flows through the parasitic bipolar transistor 22, whereby the surge current or ESD current can be safely discharged.

In this case, a breakdown voltage $V_{t2}$ (FIG. 4) must be set so as to be sufficiently higher than the trigger voltage $V_{t1}$. Otherwise, the current is concentrated at a part of the fingers at which the snapbacks initially occur, before the snapbacks occur at the remaining part of the fingers. When the voltage applied to the part of the finger, at which snapbacks initially occur, has reached the breakdown voltage $V_{t2}$, a breakdown current $I_{t2}$ flows through the part of the finger at which the snapbacks initially occur. At this time, the internal circuit of the MOS type semiconductor device may is be broken. In short, in order to solve this current concentration problem, it must be ensured that the snapbacks can evenly occur at all the fingers.

Figure 5:
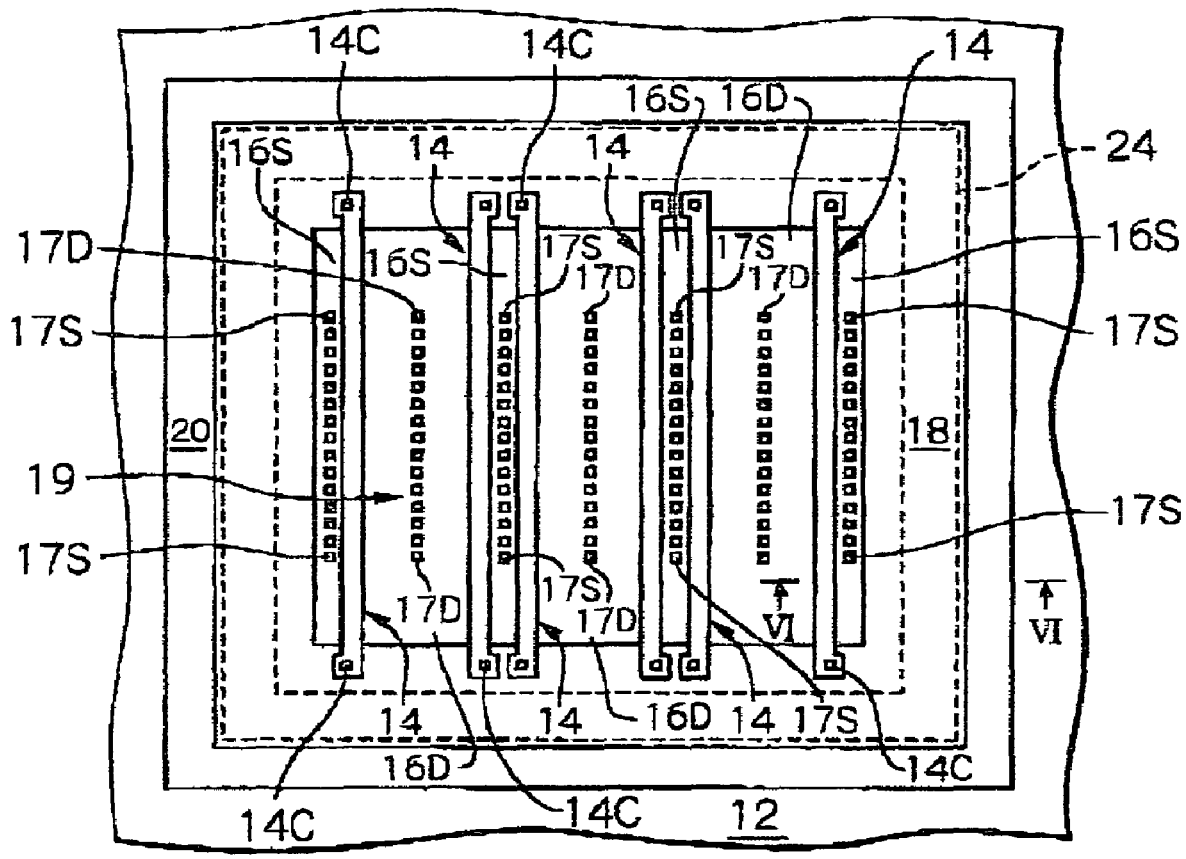
FIG. 5 is a plan view of a second prior art MOS type semiconductor device having an ESD protection arrangement.
Figure 6:
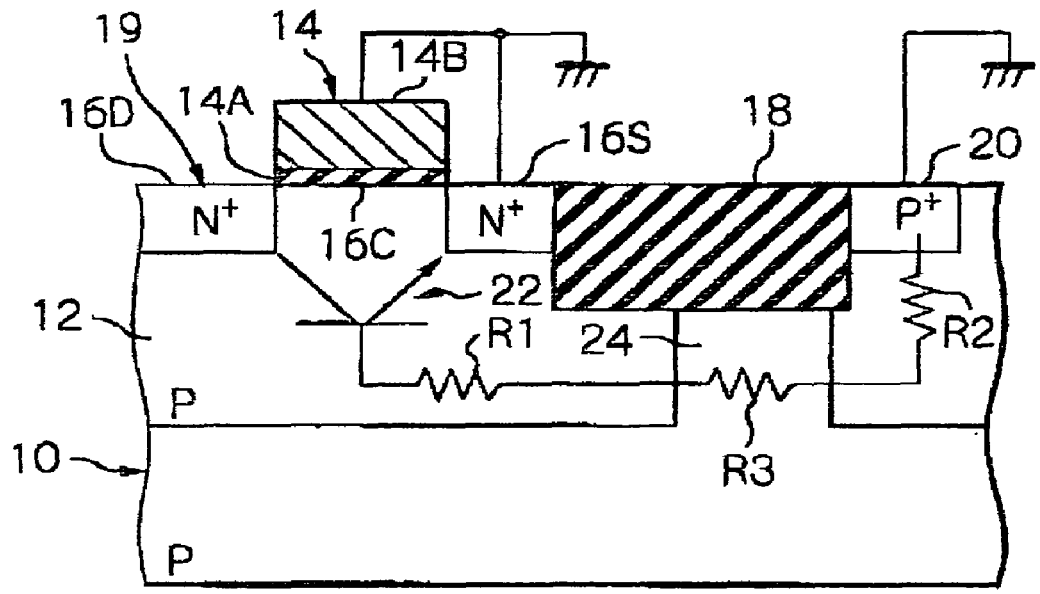
FIG. 6 is a partial cross-sectional view taken along the VI-VI line of FIG. 5.

FIGS. 5 and 6 illustrate a second prior art MOS type semiconductor device having an ESD protection arrangement, which is disclosed in, for example, JP-A-H11-274404. Note, in FIGS. 5 and 6, the features similar to those of FIGS. 1 and 2 are indicated by the same references.

In this second prior art MOS type semiconductor device having the ESD protection arrangement, a P-type well blocking region 24 is defined in the P-type well region 12 between the P+-type guard-ring 20 and the transistor-formation area 19 so as to be positioned beneath the STI layer 18, as shown in FIGS. 5 and 6. Namely, the transistor-formation area 19 is surrounded with the P-type well blocking region 24.

Note, the definition of the P-type well blocking region 24 is carried out by masking an area corresponding to the P-type well blocking region 24 when the P-type well region 12 is formed by a P-type impurity implanting process. Also, note, the P-type well blocking region 24 may be defined as a low density N-type region.

Due to the existence of the P-type well blocking region 24, a substrate resistance (which is represented by reference R3 in FIG. 6) between the transistor-formation 19 and the guard-ring 20 is increased, resulting in decline of the trigger voltage ($V_{t1}$), whereby the snapbacks can evenly occur in all the fingers in the ESD protection arrangement of the second prior art MOS type semiconductor device.

In this second prior art MOS type semiconductor, it is necessary to suitably determine a value of the substrate resistance between the transistor-formation area 19 and the guard-ring 20, before the even occurrence of the snapbacks in all the fingers can be ensured. The determination of the value of the substrate resistance is carried by adjusting a width of the P-type well blocking region 24. In this case, it is impossible to make the width of the P-type well blocking region 24 too narrow, because the P-type impurities are diffused from the P-type well region 12 into the P-type well blocking region 24 so that the P-type well blocking region 24 may disappear.

Thus, in the second prior art MOS type semiconductor device, there may be a case where it is impossible to suitably and properly set the value of the substrate resistance between the transistor-formation area 19 and the guard-ring 20 for ensuring the even occurrence of the snapbacks in all the fingers.

Figure 7:
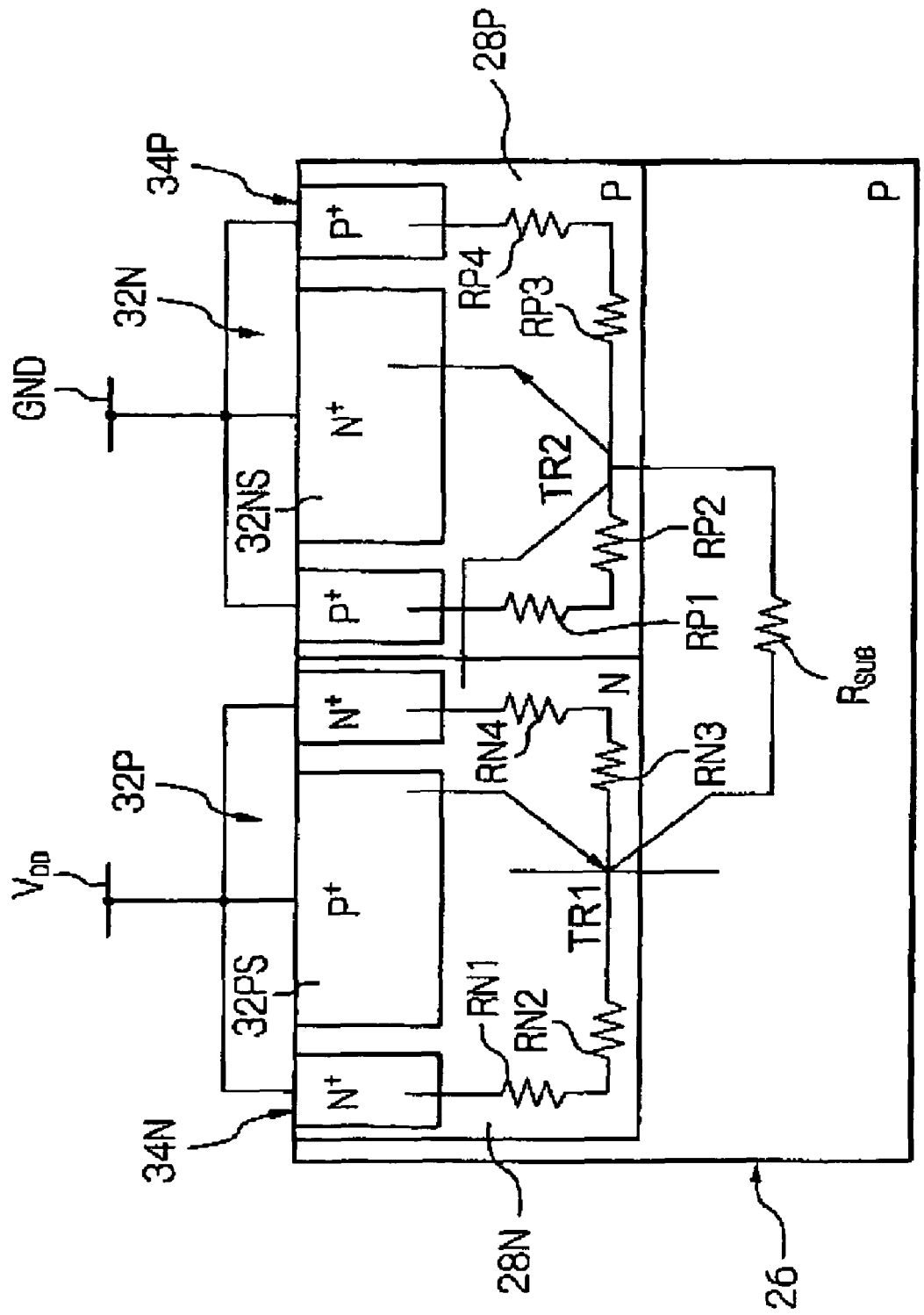
FIG. 7 is a conceptual partial cross-sectional view of a third prior art MOS type semiconductor device having an ESD protection arrangement.

FIG. 7 conceptually illustrates a third prior art MOS type semiconductor device having an ESD protection arrangement which features a complementary metal oxide semiconductor (CMOS) structure, as disclosed in, for example, an article by Tung-Yang Chen et al.; entitled "Analysis on the Dependence of Layout Parameters on ESD Robustness of CMOS Devices for Manufacturing in Deep-Submission CMOS process"; IEEE TRANSACTION SEMICONDUCTOR MANUFACTURING, VOL. 16, NO. 3, AUGUST 2003, PP. 486-500. Note, in FIG. 7, although the ESD protection arrangement is shown in a cross-sectional view, this view is different from a real one due to the conceptual illustration.

As shown in FIG. 7, the third prior art MOS type semiconductor device includes a P-type semiconductor substrate 26, which is derived from, for example, a P-type silicon wafer. Similar to the above-mentioned first prior art MOS type semiconductor device, this third prior art MOS type semiconductor device features a multi-finger structure for effectively constituting the ESD protection arrangement. In each of the fingers, an N-type well region 28N and a P-type well region 28P are formed in the P-type semiconductor is substrate 26 along an elongated gate electrode (not shown) so as to be adjacent to each other.

In the N-type well region 28N, a source region 30PS is formed as a P+-type region. Although not illustrated in FIG. 7, a drain region is formed as a P+-type region in the N-type well region 28N. In short, a P-channel MOS transistor, generally indicated by reference 32P, is produced in the N-type well region 28N, and is surrounded with a guard-ring 34N formed as an N+-type region in the N-type well region 28N.

On the other hand, in the P-type well region 28P, a source region 30NS is formed as an N+-type region. Although not illustrated in FIG. 7, a drain region is formed as an N+-type region in the P-type well region 28P.

In short an N-channel MOS transistor, generally indicated by reference 32N, is produced in the P-type well region 28P, and is surrounded with a guard-ring 34P formed as a P+-type region in the P-type well region 28P.

As shown in FIG. 7, in the P-channel MOS transistor 32P, the source region 30PS and the guard-ring 34NS are wired so as to be supplied with a power supply voltage ($V_{DD}$). Also, in the N-channel MOS transistor 32N, the source region 30NS and the guard-ring 34P are wired so as to be grounded (GND). Although not illustrated in FIG. 7, both the drain regions of the P-channel MOS and N-channel MOS transistors 32P and 32N are connected to an internal circuit of this prior art MOS type semiconductor device through the intermediary of an input buffer. Thus, it is possible to protect the internal circuit from damage which may be caused by either a negative surge current or a positive surge current.

Nevertheless, in the above-mentioned third prior art MOS type semiconductor device having the ESD protection arrangement, a latch-up problem must be solved as stated below.

In the CMOS structure having the P-channel MOS and N-channel MOS transistors 32P and 32N, a parasitic PNPN structure or parasitic thyristor structure is inevitably produced, as symbolically shown in FIG. 7. Namely, the parasitic thyristor structure includes a parasitic PNP bipolar transistor TR1 and a parasitic NPN bipolar transistor TR2. In the parasitic PNP bipolar transistor TR1, the P-type semiconductor substrate 26 serves as a collector, the N-type well 28N serves as a base, and the source region 30PS serves as an emitter. On the other hand, in the parasitic NPN bipolar transistor TR2, both the P-type semiconductor substrate 26 and the P-type well region serve a base, the N-type well region 28N serves a collector, and the source region 30NS serves as an emitter. Note, in FIG. 7, references RN1, RN2, RN3 and RN4 represent a substrate resistance of the N-type well region 28N, so references RP1, RP2, RP3 and RP4 represent a substrate resistance of the P-type well region 28P, and reference $R_{sub}$ represents a substrate resistance between the collector of the parasitic PNP bipolar transistor TR1 and the base of the NPN bipolar transistor TR2.

For example, when the drain region (not shown) of the P-channel MOS transistor 32P is supplied with a large amount of carriers (electrons), a part of the carriers is absorbed by the N-type impurity diffusion region or guard-ring 34N, but the remaining part of the carriers flows into the source region 30PS of the P-channel MOS transistor 32P to thereby cause a current in the N-type well region 28N. At this time, a potential drop occurs in the N-type well region 28N, with the potential drop corresponding to a product of a value of the substrate resistance of the N-type well region 28N and a value of the current caused therein. Thus, the parasitic PNP bipolar transistor TR1 is turned ON due to the potential drop in the N-type well region 28N. The turn-on state of the is parasitic PNP bipolar transistor TR1 causes a rise of a base potential of the NPN bipolar transistor TR2 due to the connection between the collector of the PNP bipolar transistor TR1 and the base of the NPN bipolar transistor TR2, so that the base of the NPN bipolar transistor TR2 is also turned ON, resulting in occurrence of a latch-up state in the parasitic thyristor (PNPN) structure.

The occurrence of the latch-up state results in decline of the substrate resistances between a power supply line ($V_{DD}$) and a ground line (GND), so that a large amount of current flows through the semiconductor substrate 26, resulting in damage of the ESD protection arrangement.

Note, in the above-mentioned first and second prior art MOS type semiconductor devices, the latch-up state may occur because each of the ESD protection arrangements shown in FIGS. 1 and 5 usually forms a part of the CMOS structure.

The occurrence of the latch-up state is discussed in, for example, an article by Tiziana Cavioni et al.; "Latch-Up Characterization in Standard and Twin-Tub Test Structures by Electrical Measurements, 2-D Simulations and IR Microscopy"; Proc. IEEE 1990 Int. Conference on Microelectronic Test Structures, Vol. 3, March 1990, PP. 41-46.

Also, the occurrence of the latch-up state is disclosed as a photo emission photograph in an article by Liao S. et al.; "New Observation and Analysis of Various Guard-ring Structures on Latch-Up Hardness by Backside Photo Emission Image"; Reliability Symposium Proceedings, 2003 41st Annual. 2003 IEEE International, Mar. 30-Apr. 4, 2003; PP. 92-98.

In order to prevent the occurrence of the latch-up state, it is effective for the P-channel MOS and N-channel MOS transistors 32P and 32N to be formed in the semiconductor substrate 26 so as to be spaced from each other. However, this procedure cannot be adopted because the spacing between the P-channel MOS and N-channel MOS transistors 32P and 32N results in increase in a layout area of the MOS type semiconductor device having the ESD protection arrangement.

Also, by making the substrate resistance of the semiconductor substrate 26 including the N-type and P-type well regions 28N and 28P be small, it is possible to prevent the occurrence of the latch-up state. In particular, a potential in the semiconductor substrate 26 varies in accordance with a product of a value of the substrate resistance and a value of the current flowing through the semiconductor substrate 26. Therefor, when the substrate resistance is small, the variation of the potential in the semiconductor substrate 26 is also small, so that it is hard to turn ON the parasitic bipolar transistors TR1 and TR2, resulting in the prevention of the occurrence of the latch-up state.

However, when the substrate resistance is made small, the snapback-occurrence voltage or trigger voltage ($V_{t1}$) rises, so that the local snapback-occurrence problem takes place, as stated hereinbefore. Namely, there is a tradeoff relationship between the latch-up problem and the local snapback-occurrence problem.

Figure 8:
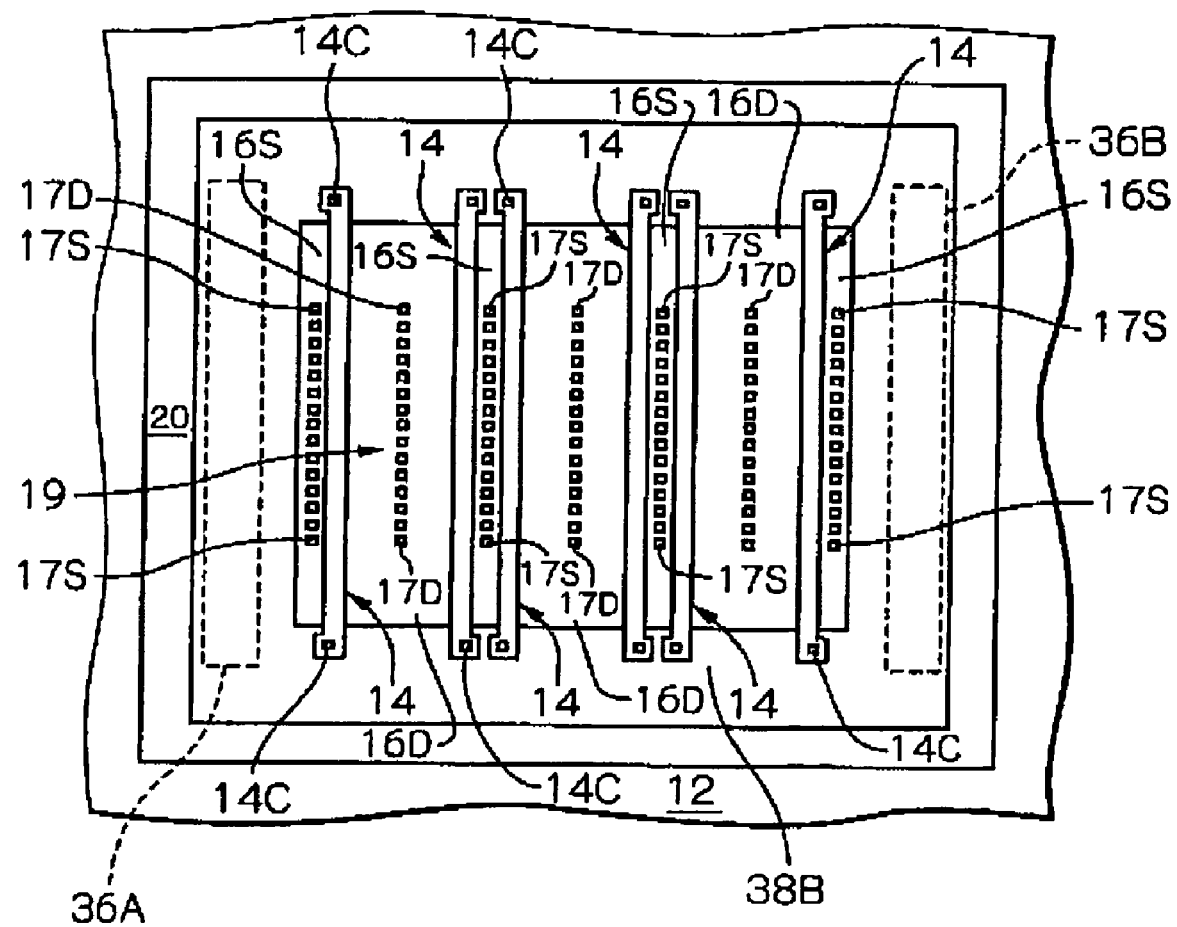
FIG. 8 is a plan view of a fourth prior art MOS type semiconductor device having an electrostatic discharge (ESD) protection arrangement.

FIG. 8, similar to FIG. 5, illustrates a fourth prior art MOS type semiconductor device having an ESD protection arrangement, as disclosed in JP-A-H11-274404. Note, in FIG. 8, the features similar to those of FIG. 5 are indicated by the same references.

The fourth prior art MOS type semiconductor device is substantially identical to the second prior art MOS type semiconductor device shown in FIGS. 5 and 6, except that two P-type well blocking regions 36A and 36B are defined in the P-type well region 12 between the guard-ring 20 and the transistor-formation area 19 so as to be extended along the outermost elongated gate electrodes 14. Namely, no P-type well blocking region is defined along each of the sides 38A and 38B of the transistor-formation area 19, which is perpendicular to the elongated gate electrodes 14.

In the fourth prior art MOS type semiconductor device, by suitably adjusting a distance between the guard-ring 20 and each of the sides 38A and 38B, it is possible to control the substrate resistance of the semiconductor substrate (10) including the P-type well region 12, so that that the uneven snapback-occurrence problem cannot takes place.

Also, in this fourth prior art MOS type semiconductor device, since the semiconductor substrate itself is formed as a low resistance substrate, the latch-up problem does not substantially occur.

FIRST EMBODIMENT

With reference to FIGS. 9 to 12, a first embodiment of a MOS type semiconductor device having an ESD protection arrangement according to the present invention is explained below.

Figure 9:
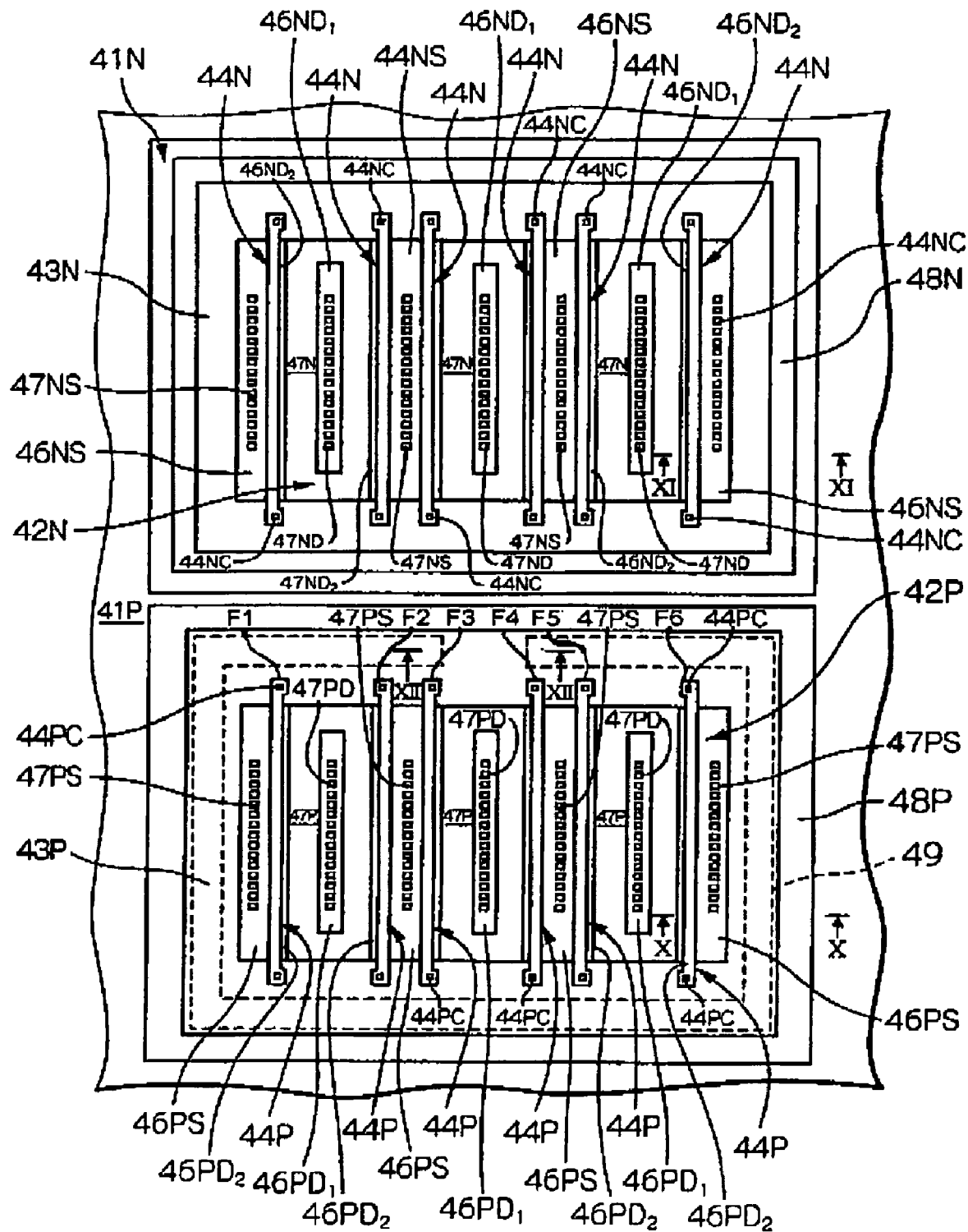
FIG. 9 is a plan view of a first embodiment of a MOS type semiconductor device having an ESD protection arrangement according to the present invention.
Figure 10:
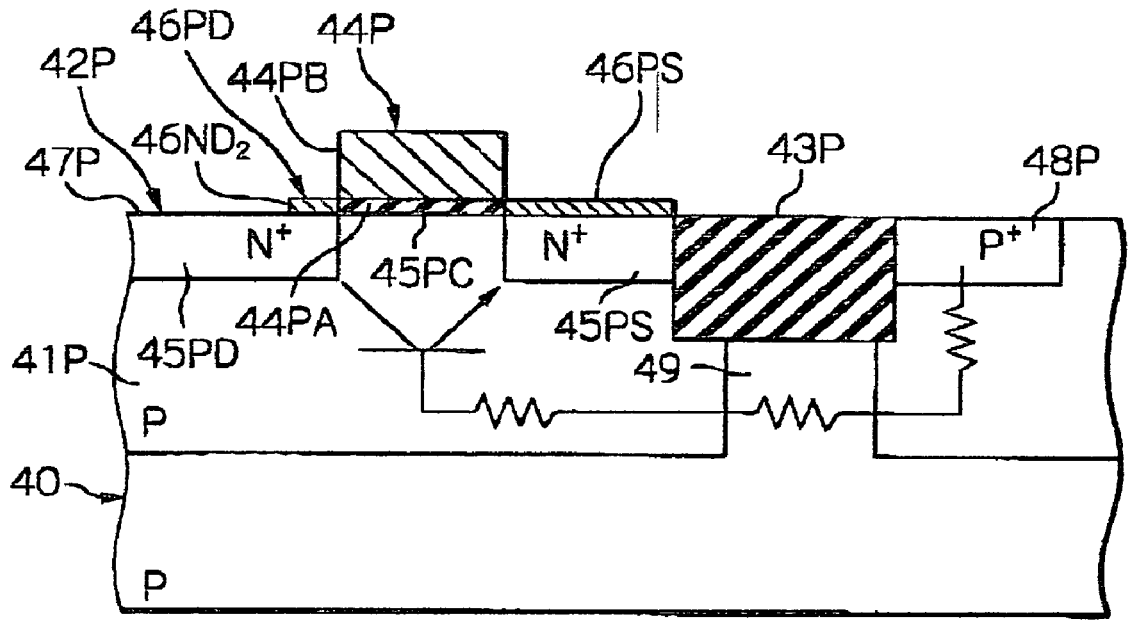
FIG. 10 is a partial cross-sectional view taken is along the X-X line of FIG. 9.

As shown in FIG. 10, the MOS type semiconductor device includes a P-type semiconductor substrate 40, which is derived from, for example, a P-type silicon wafer. As is apparent from FIGS. 9 and 10, a P-type well region 41P is formed in the P-type semiconductor substrate 40, and an N-type well region 41N is formed in the P-type well region 41P. Also, a rectangular transistor-formation area 42P is defined in the P-type well region 41P by forming an STI layer 43P therein, and a rectangular transistor-formation area 42N is defined in the N-type well region 31N by forming an STI layer 43N therein.

The MOS type semiconductor device features a multi-finger structure for effectively constituting the ESD protection arrangement.

In particular, at the transistor-formation area 42P, a plurality of elongated gate electrodes 44P are formed on the P-type well region 41P so as to be arranged in parallel to each other. As shown in FIG. 10, each of the elongated gate electrodes 44P includes a gate insulating layer 44PA formed as a silicon dioxide layer on the P-type well region 41P, and a gate electrode layer 44PB formed as a polycrystalline silicon layer on the gate insulating layer 44PA. Note, each of the ends of the gate electrode layer 44PB is connected to the P-type well region 41P through the intermediary of a via plug (not shown).

Also, at the transistor-formation area 42P, a plurality of $N^+$-type regions 45PS and 45PD are formed in the P-type well region 41P so as to be alternately arranged with respect to the elongated gate electrodes 44P. In this embodiment, the $N^+$-type region 45PS serves as a source region, and the $N^+$-type region 45PD serves as a drain region, with a channel region 45PC being defined between the source and drain regions 45PS and 45PD, as shown in FIG. 10.

Each of the source regions 45PS is covered with a silicide layer 46PS formed thereon. Also, each of the drain regions 45PD is partially covered with a central silicide layer 46PD$_1$ and two side silicide layers 46PD$_2$ formed thereon, so that a silicide blocking area 47P is defined on the drain region 45PD concerned, as best shown in FIG. 9. Each of the side silicide layers 46PD$_2$ is extended along a corresponding elongated gate electrode 44P.

Figure 11:
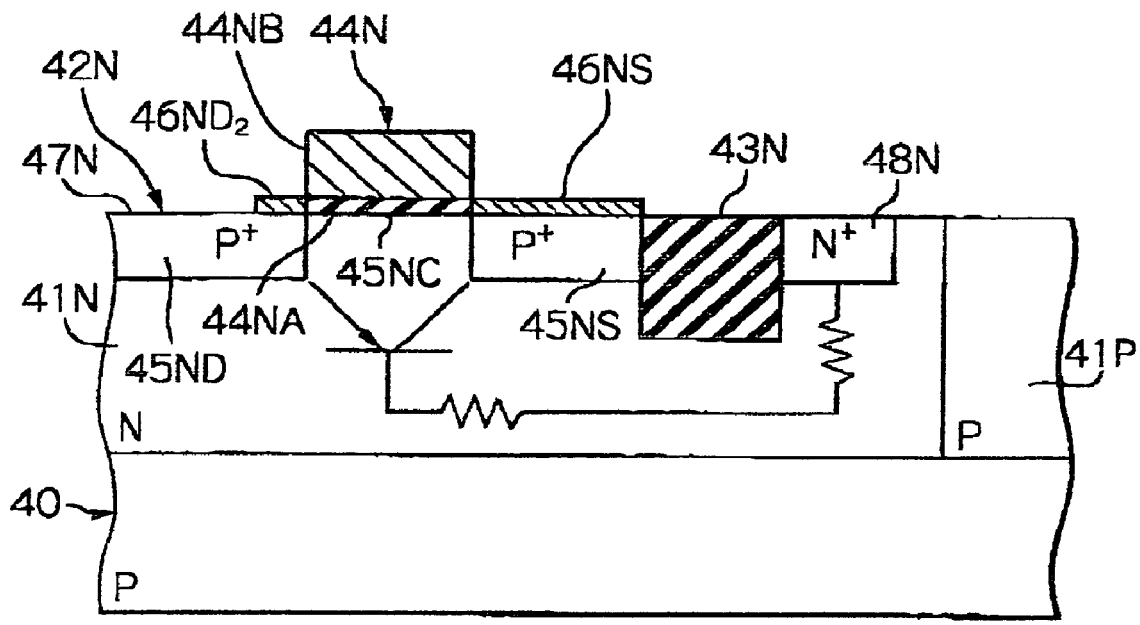
FIG. 11 is a partial cross-sectional view taken along the XI-XI line of FIG. 9.

On the other hand, at the transistor-formation area 42N, a plurality of elongated gate electrodes 44N are formed on the N-type well region 41N so as to be arranged in parallel to each other. As shown in FIG. 11, each of the elongated gate electrodes 44N includes a gate insulating layer 44NA formed as a silicon dioxide layer on the N-type well region 41N, and a gate electrode layer 44NB formed as a polycrystalline silicon layer on the gate insulating layer 44NA. Note, each of the ends of the gate electrode layer 44NB is connected to the N-type well region 41N through the intermediary of a via plug (not shown).

Also, at the transistor-formation area 42N, a plurality of P$^+$-type regions 45NS and 45ND are formed in the N-type well region 41P so as to be alternately arranged with respect to the elongated gate electrodes 44N. In this embodiment, the P$^+$-type region 45NS serves as a source region, and the P$^+$-type impurity diffusion region 45ND serves as a drain region, with a channel region 45NC being defined between the source and drain regions 45NS and 45ND, as shown in FIG. 11.

Each of the source regions 45NS is covered with a silicide layer 46NS formed thereon. Also, each of the drain regions 45ND is partially covered with a central silicide layer 46ND$_1$ and two side silicide layers 46ND$_2$ formed thereon, so that a silicide blocking area 47N is defined on the drain region 45ND concerned, as best shown in FIG. 9. Each of the side silicide layers 46ND$_2$ is extended along a corresponding elongated gate electrode 44N.

Although not shown in FIGS. 9, 10 and 11, in reality, an insulating interlayer is formed on the surface of the P-type semiconductor substrate 30 including the p-type and N-type well regions 41P and 41N, so that the elongated gate electrodes 44P and 44N, source regions 45PS and 45NS, and drain regions 45PD and 45ND are covered with the insulating interlayer.

At the transistor-formation area 42P, contact plugs 47PS are formed in the insulating interlayer above each of the source regions 45PS so as to be in contact with a corresponding silicide layer 46PS, and are aligned with each other in an extensional direction of the elongated gate electrodes 44P, as shown in FIG. 9. Similarly, contact plugs 47PD are formed in the insulating interlayer above each of the drain regions 45PD so as to be in contact with a corresponding central silicide layer 46PD$_1$, and are aligned with each other in the extensional direction of the elongated gate electrodes 44P. Also, a contact plug 44PC is formed in the insulating interlayer above an end of each of the elongated gate electrodes 44P so as to be in contact with a corresponding end of the elongated gate electrode 44P concerned.

As shown in FIGS. 9 and 10, a P$^+$-type region 48P is produced and formed as a guard-ring in the p-type well region 41P so as to surround the STI layer 43P.

In short, the elongated gate electrodes 44P, source regions 45PS, and drain regions 45PD, which are formed in the transistor-formation area 42P, define a multi-finger type ESD protection device, and one finger is defined by one of the elongated gate electrodes 44P, and the source and drain regions 46PS and 46PD arranged along the respective sides of the elongated gate electrode 44P concerned, with a plurality of N-channel MOS transistors being produced and arranged in series along each of the elongated gate electrodes 44P.

Note, in this embodiment, this multi-finger type ESD protection device includes six fingers arranged in parallel to each other.

On the other hand, at the transistor-formation area 42N, contact plugs 47NS are formed in the insulating interlayer above each of the source regions 45NS so as to be in contact with a corresponding silicide layer 46NS, and are aligned with each other in an extensional direction of the elongated gate electrodes 44N, as shown in FIG. 9. Similarly, contact plugs 47ND are formed in the insulating interlayer above each of the drain regions 45ND so as to be in contact with a corresponding central silicide layer 46ND$_1$, and are aligned with each other in the extensional direction of the elongated gate electrodes 44N. Also, a contact plug 44NC is formed in the insulating interlayer above an end of each of the elongated gate electrodes 44N so as to be in contact with a corresponding end of the elongated gate electrode 44N concerned.

As shown in FIGS. 9 and 11, an N$^+$-type region 48N is produced and formed as a guard-ring in the N-type well region 41N so as to surround the STI layer 43N.

In short, the elongated gate electrodes 44N, source regions 45NS, and drain regions 45ND, which are formed in the transistor-formation area 42N, define a multi-finger type ESD protection device, and one finger is defined by one of the elongated gate electrodes 44N, and the source and drain regions 45NS and 45ND arranged along the respective sides of the elongated gate electrode 44N concerned, with a plurality of P-channel MOS transistors being produced and arranged in series along each of the elongated gate electrodes 44N. Note, in this embodiment, this multi-finger type ESD protection device includes six fingers, generally indicated by references F1, F2, F3, F4, F5 and F6.

In the ESD protection devices defined in the transistor-formation areas 42P and 42N, the drain regions 45PD and 45ND are wired so as to be connected to an electrode pad (not shown) formed on the aforesaid insulating interlayer, with the electrode pad being connected to an internal circuit (not shown) through the intermediary of an input buffer (not shown). Also, the source regions 45PS are wired so as to be supplied with a power supply voltage ($V_{DD}$), and source regions 45NS are wired so as to be grounded (GND).

Figure 12:
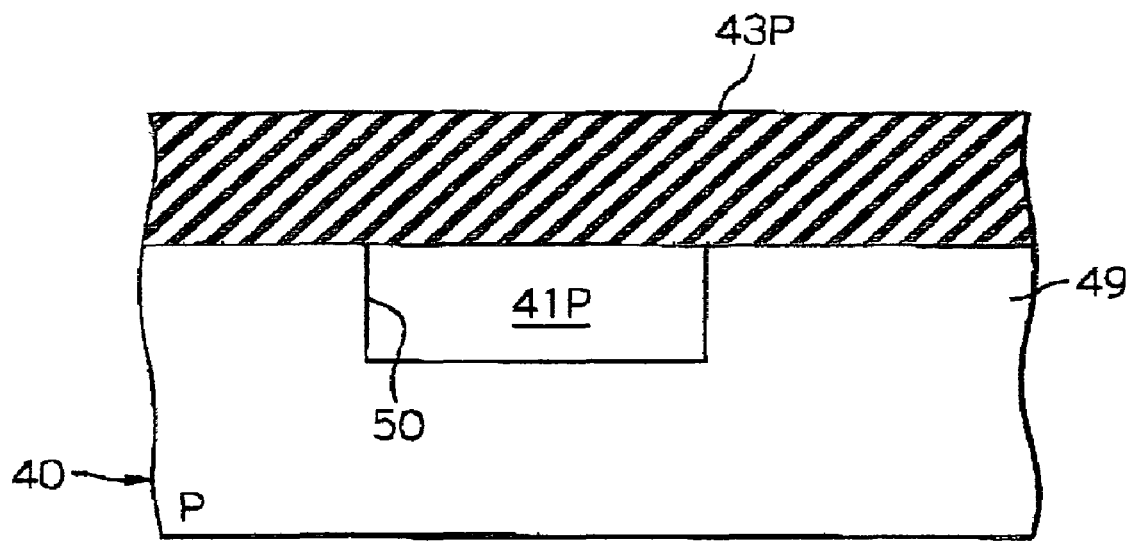
FIG. 12 is a partial cross-sectional view taken along the XII-XII line of FIG. 9.

In this first embodiment, a P-type well blocking region 49 is defined in the P-type well region 41P between the transistor-formation area 42P and the P-type impurity diffusion region or guard-ring 48P so as to be positioned beneath the STI layer 43P, as shown in FIGS. 9 and 10. In particular, the P-type well blocking region 49 is configured so as to define a gap 50 beside the center of the side 51 of the transistor-formation area 42P which is adjacent to the transistor-formation area 42N, and which is perpendicular to the extensional direction of the elongated gate electrodes 44P, as shown in FIGS. 9 and 12. Note, as is apparent from FIG. 12, the gap 50 is defined as a part of the P-type well region 41P.

The definition of the P-type well blocking region 49 may be carried out by masking an area corresponding to the P-type well blocking region 49 when the P-type well region 41P is formed by a P-type impurity implanting process, and then the formation of the STI layer 43P is carried out along the P-type well blocking region 49.

Figure 13:
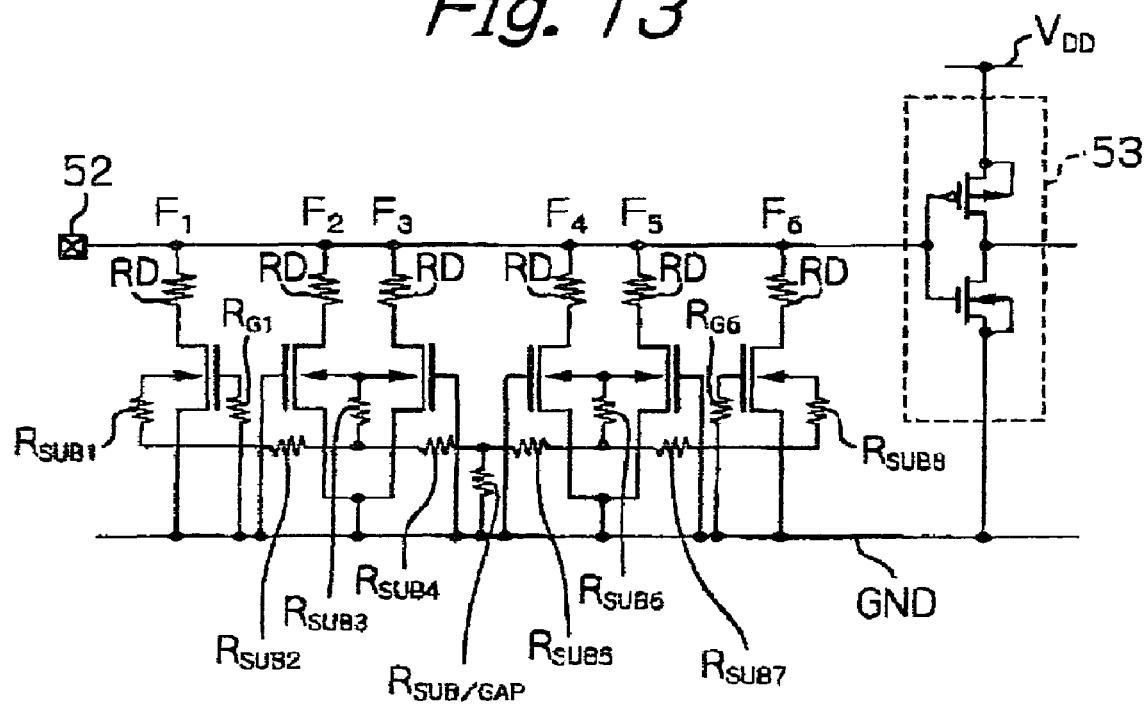
FIG. 13 is a circuit diagram of a multi-finger type ESD protection device included in the MOS type semiconductor device shown in FIG. 9

FIG. 13 shows an equivalent circuit of the ESD protection device defined in the transistor-formation area 42P. Note, in this drawing, references F1 to F6 represent the respective fingers, as already stated above.

As shown in FIG. 13, each of the fingers F1 to F6 includes an N-channel MOS transistor, and these N-channel MOS transistors are connected to each other in series. A drain (45PD) of each of the N-channel MOS transistors is connected to an input electrode pad 52 through the intermediary of a drain resistance RD, which is derived from the definition of the silicide blocking area 47P on each of the drain regions 45PD.

In FIG. 13, reference 53 indicates an input buffer which is formed as a complementary metal oxide semiconductor (CMOS) inverter formed in the P-type semiconductor substrate 40, and the CMOS inverter includes a P-channel MOS transistor and an N-channel MOS transistor associated with each other. A common gate of the input buffer or CMOS inverter BU is connected to the input electrode pad 52, and a common drain of the CMOS inverter 53 is connected to an internal circuit (not shown) formed in the P-type semiconductor substrate 40. Also, in the input buffer or CMOS inverter 53, a source of the P-channel MOS transistor is connected to a power supply voltage line ($V_{DD}$), and a source of the N-channel MOS transistor is connected to a ground line (GND).

In FIG. 13, respective references $R_{SUB1}$, $R_{SUB2}$, $R_{SUB3}$, $R_{SUB4}$, $R_{SUB5}$, $R_{SUB6}$, $R_{SUB7}$ and $R_{SUB8}$ represent substrate resistances between the channel regions 45PC of the fingers F1 to F6. For example, the channel region 45PC of the finger F1 and the channel region 45PC of the finger F2 are connected to each other through the intermediary of the substrate resistances. $R_{SUB1}$, $R_{SUB2}$ and $R_{SUB3}$. Also, the channel region 45PC of the finger F3 and the channel region 45PC of the finger F4 are connected to each other through the intermediary of the substrate resistances $R_{SUB3}$, $R_{SUB4}$, $R_{SUB5}$ and $R_{SUB6}$.

In FIG. 13, reference $R_{SUB/GAP}$ represents a substrate resistance, which is derived from the gap 50 positioned beside the center of the side 51 of the transistor-formation area 42P. Namely, the substrate resistance $R_{SUB/GAP}$ intervenes between the ground line (GND) and each of the channel regions 45PC of the fingers F1 to F6, and is positioned at the connection between the channel regions 45PC of the central fingers F3 and F4. As a result, a substrate resistance between the ground line (GND) and each of the channel regions 45PC of the outermost fingers F1 and F6 is relatively large, whereas a substrate resistance between the ground line (GND) and each of the channel regions 45PC of the central fingers F3 and F4 is relatively small.

As already stated, the gate electrode layer 44PA of each of the elongated gate electrodes 44P is connected to the P-type well region 41P at the ends thereof. Also, the gap 50 is positioned beside the center of the side 51 of the transistor-formation area 42P. Accordingly, in the fingers F2 to F5, a gate resistance between the ground line (GND) and each of the elongated gate electrodes 44P is considerably small in comparison with those in the outermost fingers F1 and F6. Thus, in the fingers F2 to F5, each of the N-channel MOS transistors may be regarded as a gg(gate-grounded)-NMOS transistor. Note, in FIG. 13, respective references $RG_{G1}$ and $RG_{G6}$ represent gate resistances between the ground line (GND) and the elongated gate electrodes 44P of the outermost fingers F1 and F6, and each of the gate resistances $RG_{G1}$ and $RG_{G6}$ may fall within a range from 100Ω to 1 kΩ.

Next, an operation of the first embodiment of the MOS type semiconductor device according to the present invention will be explained below.

For example, when the input electrode pad 52 is supplied with a positive surge current, it flows into the drain regions 45ND of the ESD protection device defined in the transistor-formation area 42P. At this time, a snapback occurs in each of the outermost fingers F1 and F6, because a substrate resistance of the outermost fingers F1 and F6 is larger than those in the remaining fingers F2 to F5. Then, the substrate currents, produced by the occurrence of the snapbacks, flow toward the gap 50 through the intermediary of the substrate portions of the fingers 2 and 5 and the substrate portions of the fingers 3 and 4 in order, so that a substrate potential rises at each of the substrate portions of the fingers 2 and 5 and fingers 3 and 4. As a result, a snapback occurs in each of the fingers F2 and F5, and then a snapback occurs in each of the fingers F3 and F4. Namely, the snapbacks occur in a chain-reaction manner from the outermost fingers F1 and F6 toward the central fingers F3 and F4. Thus, it is possible to safely discharge the positive surge current into the ground line (GND).

According to the first embodiment, it is possible to easily and optimally determine a value of the substrate resistance $R_{SUB/GAP}$ by merely adjusting a width of the gap 50, so that the occurrence of the snapbacks in all the fingers F1 to F6 in the chain-reaction manner can be ensured. In this case, in order to properly control the occurrence of the snapbacks in all the fingers F1 to F6, it is unnecessary to increase a distance between the transistor-formation area 42P and the guard-ring 48P, and it is unnecessary to make the width of the P-type well blocking region 49 to be excessively narrow.

Also, due to the existence of the gap 50 beside the center of the side 51 of the transistor-formation area 42P, not only can the substrate resistances of the central fingers F3 and F4 be made relatively small, but also the substrate resistance between the P-type well region 41P and the N-type well region 41N can be made small. Thus, it is possible to effectively prevent occurrence of a latch-up state in the ESD protection devices defined in the transistor-formation area 42P and 42N.

According to the first embodiment, it is possible to properly solve both the aforesaid local snapback-occurrence and latch-up problems without increasing a distance between the P-type well region 41P and the N-type well region 41N.

Before the occurrence of the snapbacks in all the fingers F1 to F6 can be securely ensured, the width of the gap 50 should be set as small as possible. Preferably, a setting of less than a width of the drain region 45PD should be given to the width of the gap 50.

In short, in this embodiment, the semiconductor substrate exhibits a high resistance due to the existence of the P-type well blocking region 49 surrounding the transistor-formation are 41P, and thus it is impossible to avoid the latch-up problem. However, according to the present invention, by merely adjusting a width of the gap 50, it is possible to set a desirable resistance distribution in the semiconductor substrate 40 so that both the local snapback-occurrence and latch-up problems.

SECOND EMBODIMENT

Figure 14:
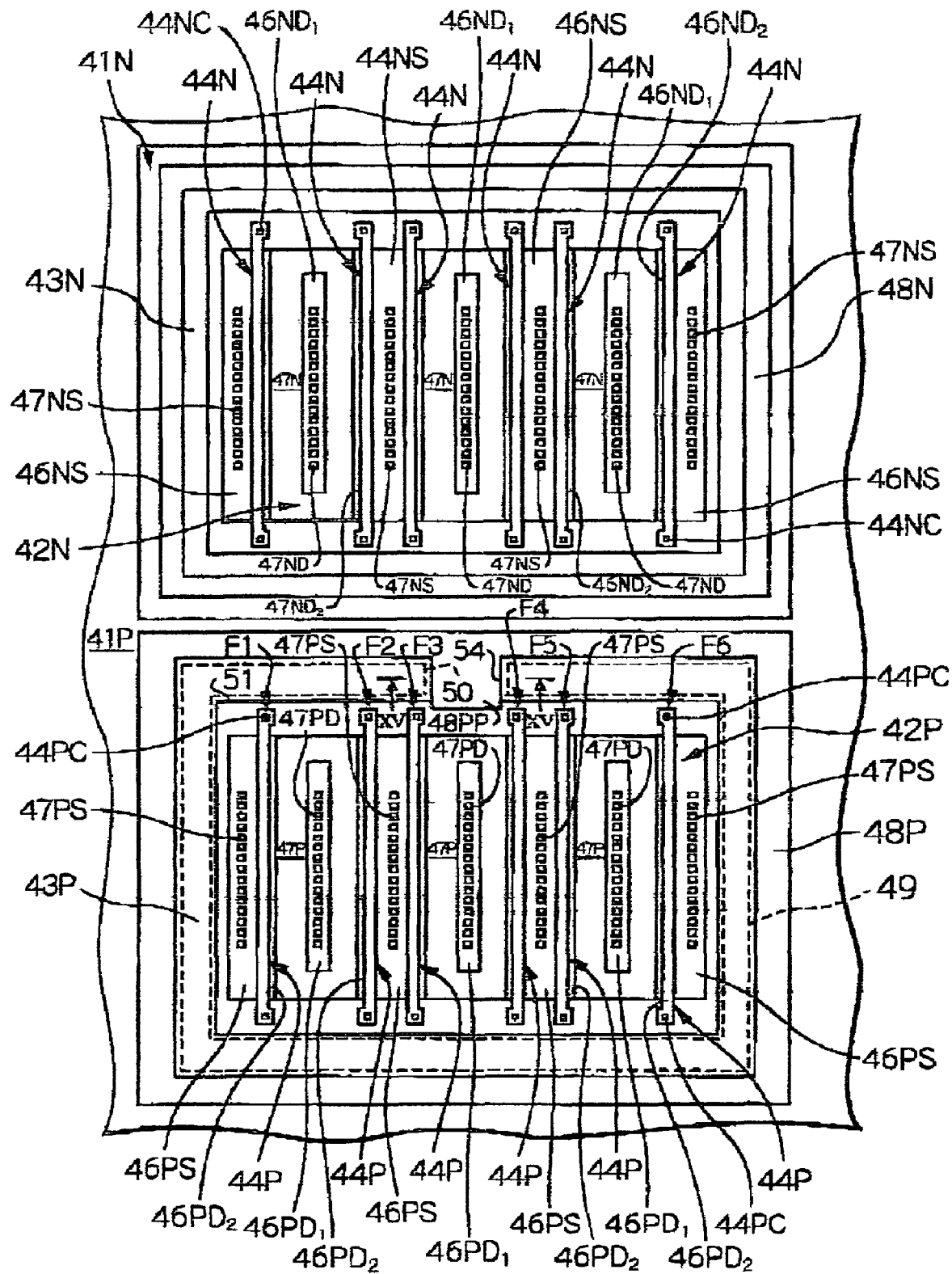
FIG. 14 is a plan view of a second embodiment of the MOS type semiconductor device having the ESD protection arrangement according to the present invention.
Figure 15:
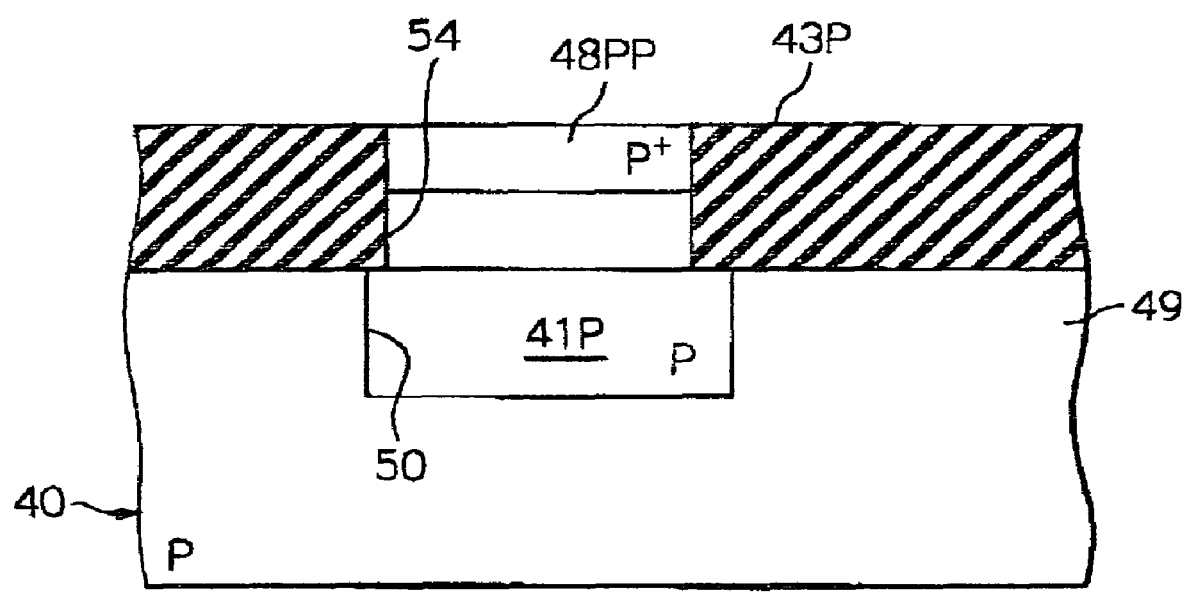
FIG. 15 is a partial cross-sectional view taken along the XV-XV line of FIG. 14.

FIGS. 14 and 15 shows a second embodiment of the MOS type semiconductor device having the ESD protection arrangement according to the present invention. Note, in FIGS. 14 and 15, the features similar to those of FIGS. 9 and 12 are indicated by the same references.

This second embodiment is substantially identical to the above-mentioned first embodiment except that a gap 54 is formed in the STI layer 43P at the center of the side 51 of the transistor-formation area 42P which is adjacent to the transistor-formation area 42N, and the guard-ring 48P has a protrusion 48PP integrally extended therefrom into the gap 54.

In this second embodiment, it is possible to make the substrate resistance ($R_{SUD/GAP}$) smaller between the transistor-formation area 42P and the guard-ring 48P, due to the existence of the protrusion 48PP formed as a part of the guard-ring 48P, and thus the occurrence of the snapbacks in all the fingers F1 to F6 can be further securely ensured.

Also, according to the second embodiment, it is possible to optimally determine the value of the substrate resistance ($R_{SUB/GAP}$) by adjusting not only the width of the gap 50 but also a length of the protrusion 48PP.

Note, in the second embodiment, the ESD protection device operate in substantially the same manner as the is above-mentioned first embodiment shown in FIGS. 9 to 13.

THIRD EMBODIMENT

Figure 16:
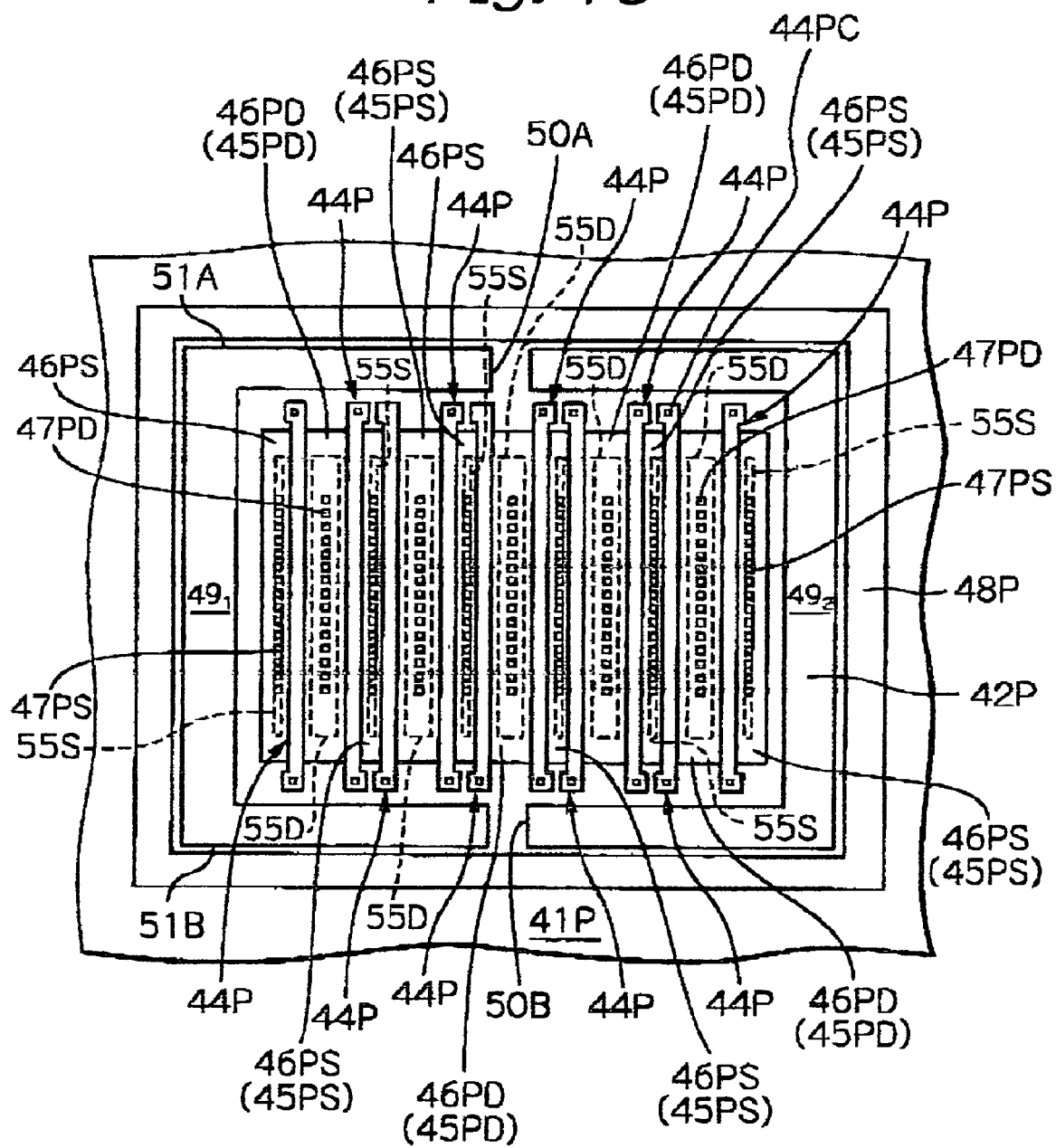
FIG. 16 is a plan view of a third embodiment of the MOS type semiconductor device having the ESD protection arrangement according to the present invention.

FIG. 16 shows a third embodiment of the MOS type semiconductor device having the ESD protection arrangement according to the present invention. Note, in FIG. 16, the features similar to those of FIG. 9 are indicated by the same references.

In FIG. 16, only an ESD protection device defined in a rectangular transistor-formation area 42P is illustrated, and an STI layer (43P) is eliminated from FIG. 16 to directly illustrate a pair of P-type well blocking regions $49_1$ and $49_2$ by solid lines.

In the third embodiment, the ESD protection device features a multi-finger structure including ten fingers, and each of the fingers includes an elongated gate electrode 44P, and source and drain regions 45PS and 45PD arranged along the respective sides of the elongated gate electrode 44P concerned. Each of the source regions 45PS is covered with a silicide layer 46PS formed thereon. Similarly, each of the drain regions 45PS is covered with a silicide layer 47PD formed thereon. Note, in this embodiment, no silicide blocking area is defined in the silicide layer 47PD. Contact plugs 47PS are arranged on each of the source region 45PS so as to be aligned with each other in an extensional direction of the elongated gate electrodes 44P, and contact plugs 47PD are arranged on each of the drain region 45PD so as to be aligned with each other in the extensional direction of the elongated gate electrodes 44P. In short, similar to the above-mentioned first embodiment a plurality of N-channel MOS transistors are produced in the transistor-formation area 42P so as to be arranged in series along each of the elongated gate electrodes 44P.

Also, in the third embodiment, an elongated P-type well blocking region 55S is defined in the P-type well region 41P beneath each of the source regions 45PS along the alignment of the contact plugs 47PS. Also, an elongated P-type well blocking region 55D is defined in the P-type well region 41P beneath each of the source regions 45PS along the alignment of the contact plugs 47PS. Thus, a substrate resistance is increased at the transistor-formation area 42P due to the existence of the elongated P-type well blocking region 55S and 55D.

Further, in the third embodiment, the pair of P-type well blocking regions $49_1$ and $49_2$ have a generally C-shaped configuration, and are arranged such that two gaps 50A and 50B are defined therebetween beside the respective centers of sides 51A and 51B of the transistor-formation area 42P which are perpendicular to the extensional direction of the elongated gate electrodes 44P.

In the above-mentioned first embodiment, when a snapback occurs in each of the fingers F1 to F6, the occurrence of the snapback is apt to be started at one end of each finger which is the side 51 of the transistor-formation area 42P which is close to the gap 50 of the P-type well blocking region 49. When the occurrence of the snapback is started at the end of the finger concerned, a large amount of current is liable to be concentrated at the end of the finger. In this case, a large amount of heat may be generated at the end of the finger In the third embodiment, when a snapback occurs in each of the fingers, the occurrence of the snapback is apt to be started at a center of each finger because the respective two gaps 50A and 50B are positioned beside the centers of the sides 51A and 51B of the transistor-formation area 42P. Then, the occurrence of the snapback is shifted from the center of the finger concerned toward the ends thereof, and thus it is possible to prevent a local generation of heat in the semiconductor device.

Note, in the third embodiment, the ESD protection device operates in substantially the same manner as the above-mentioned first embodiment shown in FIGS. 9 to 13.

FOURTH EMBODIMENT

Figure 17:
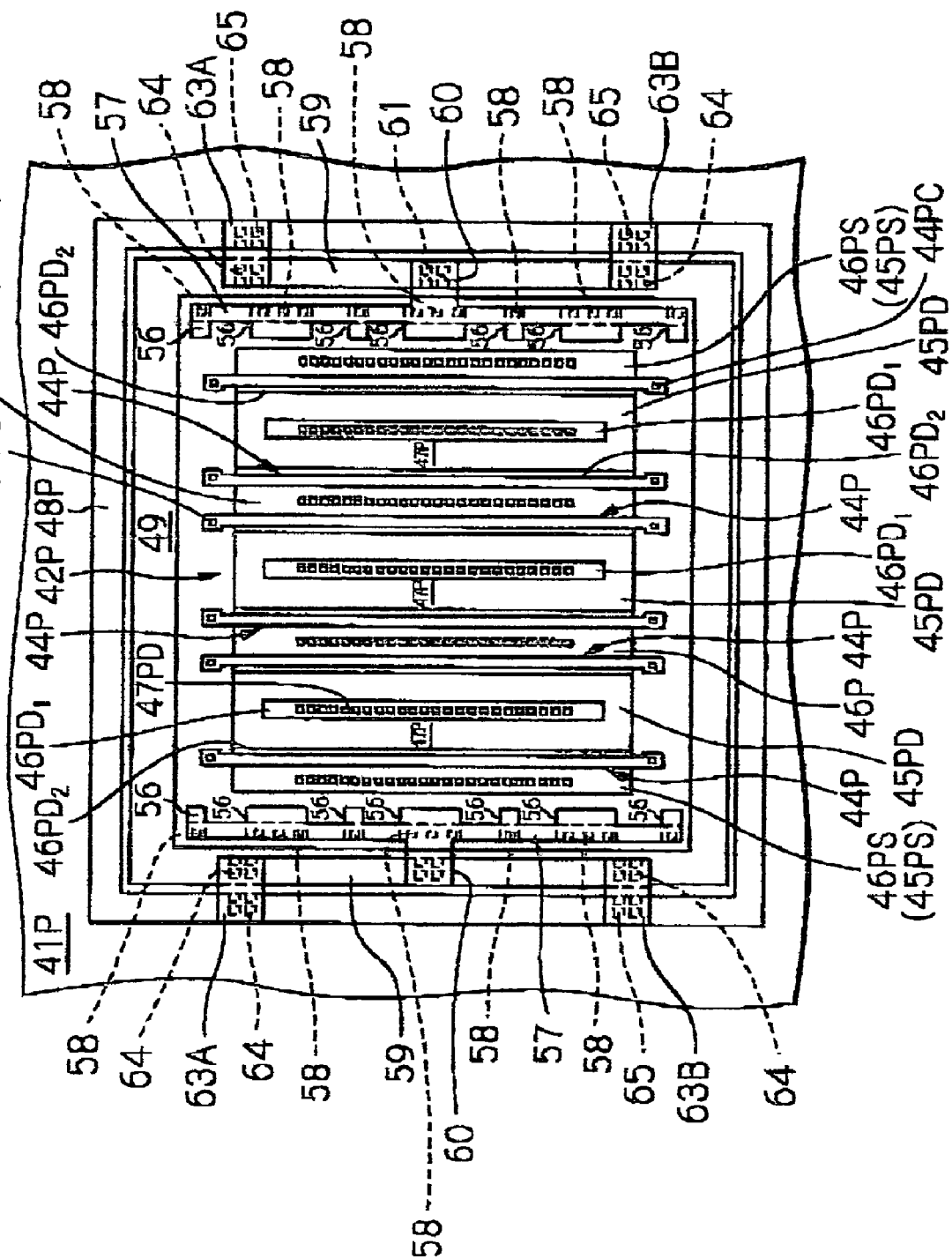
FIG. 17 is a plan view of a fourth embodiment of the MOS type semiconductor device having the ESD protection arrangement according to the present invention.

FIG. 17 shows a fourth embodiment of the MOS type semiconductor device having the ESD protection arrangement according to the present invention. Note, in FIG. 17, the features similar to those of FIG. 9 are indicated by the same references.

In FIG. 17, only an ESD protection device defined in a rectangular transistor-formation area 42P is illustrated, and an STI layer (43P) is eliminated from FIG. 17 to directly illustrate a P-type well blocking region 49 by solid lines. Also, a multi-finger structure of the ESD protection device is constituted in substantially the same manner as in the above-mentioned first embodiment shown in FIGS. 9 to 13.

In the forth embodiment, a plurality of $P^+$-type regions 56 are formed in a P-type well region 41P at the transistor-formation area 42P so as to be arranged along each of the outermost fingers, and these $P^+$-type regions 56 are connected to a conductive layer 57 through via plugs 58. A resistor layer 59 is formed on the STI layer (43P) above a side of the P-type well blocking region 49 which is close to each of the outermost fingers, and is connected to a conductive layer 60, which is integrally extended from the conductive layer 57, through via plugs 61. Also, the resistor layer 59 is connected to a pair of conductive layers 63A and 63B through via plugs 64, and these conductive layers 63A and 63B are connected to a $P^+$-type guard-ring 48P through via plugs 65. In short, the $P^+$-type regions 56 are connected to the guard-ring 48P through the intermediary of the resistor layer 59.

Note, although not shown in FIG. 17, the MOS type semiconductor device includes a multi-layered wiring structure, and the aforesaid various conductive layers and the various via plugs are formed in the multi-layer wiring structure.

Preferably, the resistor layer 59 is composed of polycrystalline silicon. In this case, it is possible to simultaneously carry out the formation of the resistor layer 59 when gate electrode layers of elongated gate electrodes 44P are formed.

In the fourth embodiment, substrate resistances at the outermost fingers are smaller in comparison with those at the central fingers. Thus, when a positive surge current flows into the drain regions 45ND of the ESD protection device, snapbacks initially occur in the central fingers. Then, the occurrence of the snapbacks is shifted toward the outermost fingers. Namely, the snapbacks occur in a chain-reaction manner from the central fingers toward the outermost fingers.

Of course, although a value of a substrate resistance must be optimally determined at each of the outermost fingers such that the occurrence of the snapbacks in all the fingers can be securely ensured, it is possible to easily carry out the optimal determination of the substrate resistance value by adjusting a resistance value of the resistor layer or polycrystalline silicon layer 59.

FIFTH EMBODIMENT

Figure 18:
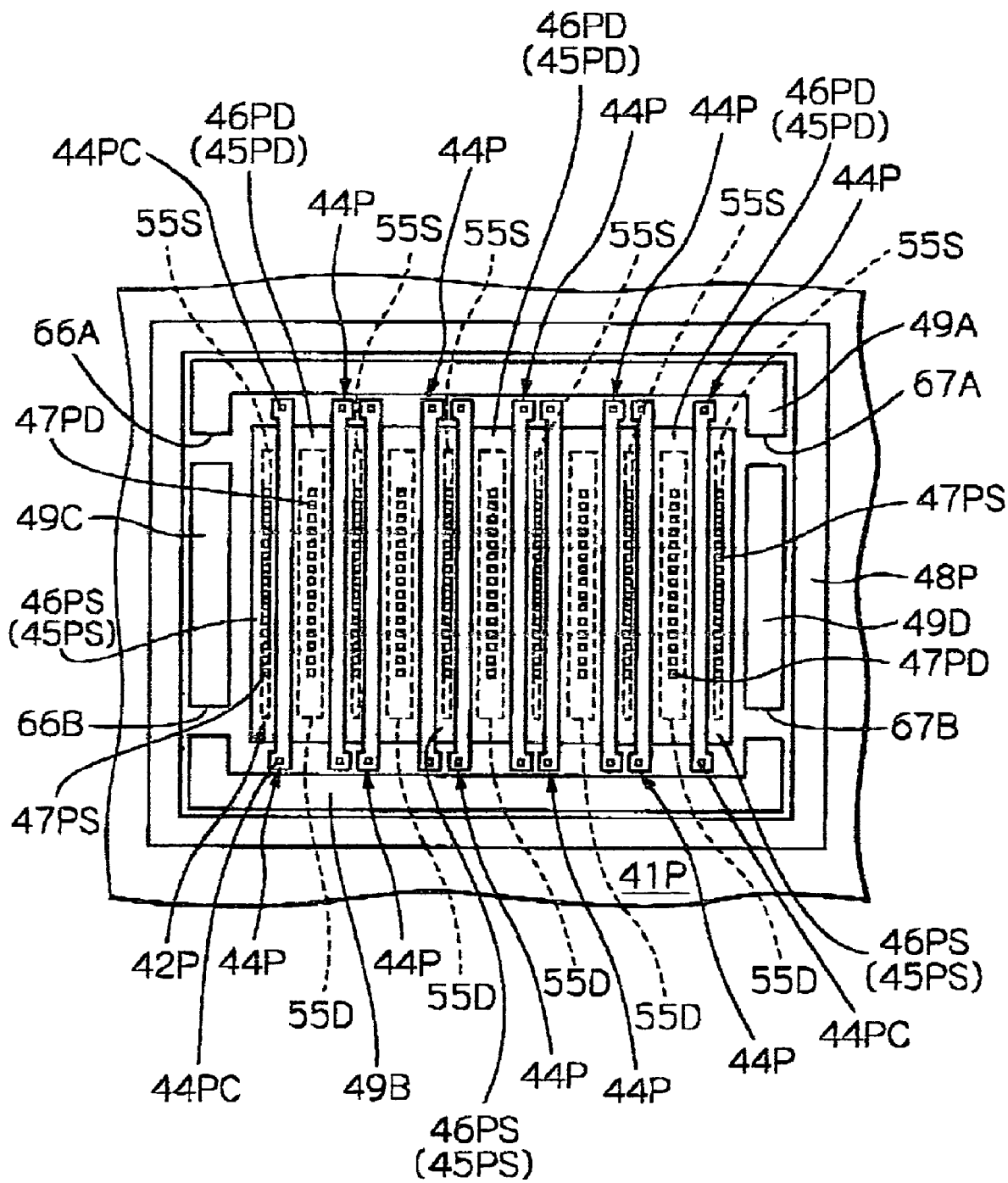
FIG. 18 is a plan view of a fifth embodiment of the MOS type semiconductor device having the ESD protection arrangement according to the present invention.

FIG. 18 shows a fifth embodiment of the MOS type semiconductor device having the ESD protection arrangement according to the present invention. Note, in FIG. 18, the features similar to those of FIG. 16 are indicated by the same references.

In FIG. 18, only an ESD protection device defined in a rectangular transistor-formation area 42P is illustrated, and an STI layer (43P) is eliminated from FIG. 18 to directly illustrate P-type well blocking regions 49A, 49B, 49C and 49D by solid lines. Also, a multi-finger structure of the ESD protection device is constituted in substantially the same manner as in the above-mentioned third embodiment shown in FIG. 16.

In the fifth embodiment, as shown in FIG. 18, the P-type well blocking regions 49A and 49B have a generally C-shaped configuration, and are arranged along the respective opposed sides of the transistor-formation area 42P which are perpendicular to an extensional direction of elongated gate electrodes 44P. Also, the P-type well blocking regions 49C and 49D have an elongated configuration, and are arranged along the respective opposed sides of the transistor-formation area 42P which are in parallel to the extensional direction of the elongated gate electrodes 44P. Namely, the arrangement of the regions P-type well blocking regions 49A, 49B, 49C and 49D is carried out such that a pair of gaps 66A and 66B and a pair of gaps 67A and 67B are defined therebetween beside the respective outermost fingers of the ESD protection device produced in the transistor-formation area 42P. Preferably, as shown in FIG. 18, the pair of gaps 66A and 66B and the pair of gaps 67A and 67B are symmetrically positioned with respect to a central axis passing through the rectangular transistor-formation area 42P in parallel with the extensional direction of the elongated gate electrodes 44P. Similar to the gap 50 used in the above-mentioned first embodiment, each of the gaps 66A, 66B, 67A and 67B is defined as a part of the P-type well region 41P.

Similar to the fourth embodiment shown in FIG. 17, in is this fifth embodiment, substrate resistances at the outermost fingers are smaller in comparison with those at the remaining fingers due to the existence of the gaps 66A, 66B, 67A and 67B. Thus, when a positive surge current flows into the drain regions 45ND of the ESD protection device, snapbacks initially occur in the central fingers. Then, the occurrence of the snapbacks is shifted toward the outermost finger. Namely, the snapbacks occur in a chain-reaction manner from the central fingers toward the outermost fingers.

Of course, although a value of a substrate resistance must be optimally determined at each of the outermost fingers such that the occurrence of the snapbacks in all the fingers can be securely ensured, it is possible to easily carry out the optimal determination of the substrate resistance value by adjusting widths of the gaps 66A, 66B, 67A and 67B.

Also, in the fifth embodiment, the ESD protection device is constituted so that a substrate current flows in a direction perpendicular to the extensional direction of the elongated gate electrodes 44P, and thus it is possible to further facilitate the occurrence of the snapbacks in the chain-reaction manner.

SIXTH EMBODIMENT

Figure 19:
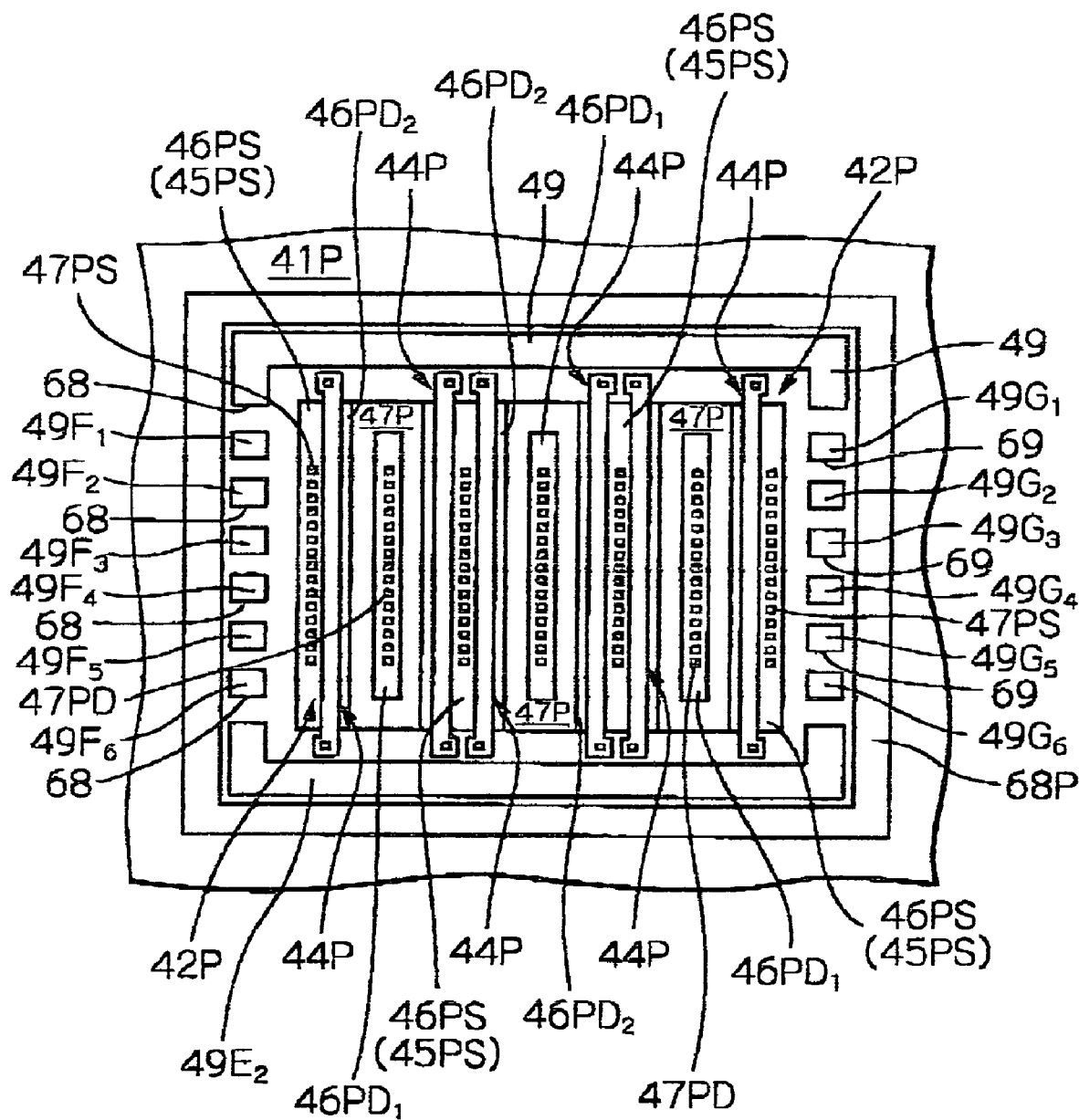
FIG. 19 is a plan view of a sixth embodiment of the MOS type semiconductor device having the ESD protection arrangement according to the present invention.

FIG. 19 shows a sixth embodiment of the MOS type semiconductor device having the ESD protection arrangement according to the present invention. Note, in FIG. 19, the features similar to those of FIG. 9 are indicated by the same references.

In FIG. 19, only an ESD protection device defined in a rectangular transistor-formation area 42P is illustrated, and an STI layer (43P) is eliminated from FIG. 19 to directly illustrate P-type well blocking-regions $49E_1$, $49E_2$, $49F_1$ to $49F_6$, and $49G_1$ to $49G_6$ by solid lines. Also, a multi-finger structure of the ESD protection device is constituted in substantially the same manner as in the above-mentioned first embodiment shown in FIGS. 9 to 13.

In the sixth embodiment, as shown in FIG. 19, the P-type well blocking regions $49E_1$ and $49E_2$ have a generally C-shaped configuration, and are arranged along the respective opposed sides of the transistor-formation area 42P which are perpendicular to an extensional direction of elongated gate electrodes 44P. Also, the P-type well blocking regions $49F_1$ to $49F_6$ have a square configuration, and are arranged along one of the opposed sides of the transistor-formation area 42P which are in parallel to the extensional direction of the elongated gate electrodes 44P. Further, the P-type well blocking regions $49G_1$ to $49G_6$ have a square configuration, and are arranged along the other side of the transistor-formation area 42P which is in parallel to the extensional direction of the elongated gate electrodes 44P. Namely, the arrangement of the regions P-type well blocking regions $49E_1$, $49E_2$, $49F_1$ to $49F_6$, and $49G_1$ to $49G_6$ is carried out such that a set of seven gaps 68 and a set of seven gaps 69 are defined therebetween beside the respective outermost fingers of the ESD protection device produced in the transistor-formation area 42P. Preferably, as shown in FIG. 19, the set of seven gaps 68 and the set of seven gaps 69 are symmetrically positioned with respect to a central axis passing through the rectangular transistor-formation area 42P in parallel with the extensional direction of the elongated gate electrodes 44P. Similar to the gap 50 used in the above-mentioned first embodiment, each of the gaps 68 and 69 is defined as a part of the P-type well region 41P.

Similar to the fourth embodiment shown in FIG. 17, in this sixth embodiment, substrate resistances at the outermost fingers are smaller in comparison with those at the central fingers. Thus, when a positive surge current flows into the drain regions 45ND of the ESD protection device, snapbacks initially occur in the central fingers. Then, the occurrence of the snapbacks is shifted toward the outermost finger. Namely, the snapbacks occur in a chain-reaction manner from the central fingers toward the outermost fingers.

Of course, although a value of a substrate resistance must be optimally determined at each of the outermost fingers such that the occurrence of the snapbacks in all the fingers can be securely ensured, it is possible to easily carry out the optimal determination of the substrate resistance value by adjusting widths of the gaps 68 and 69.

SEVENTH EMBODIMENT

Figure 20:
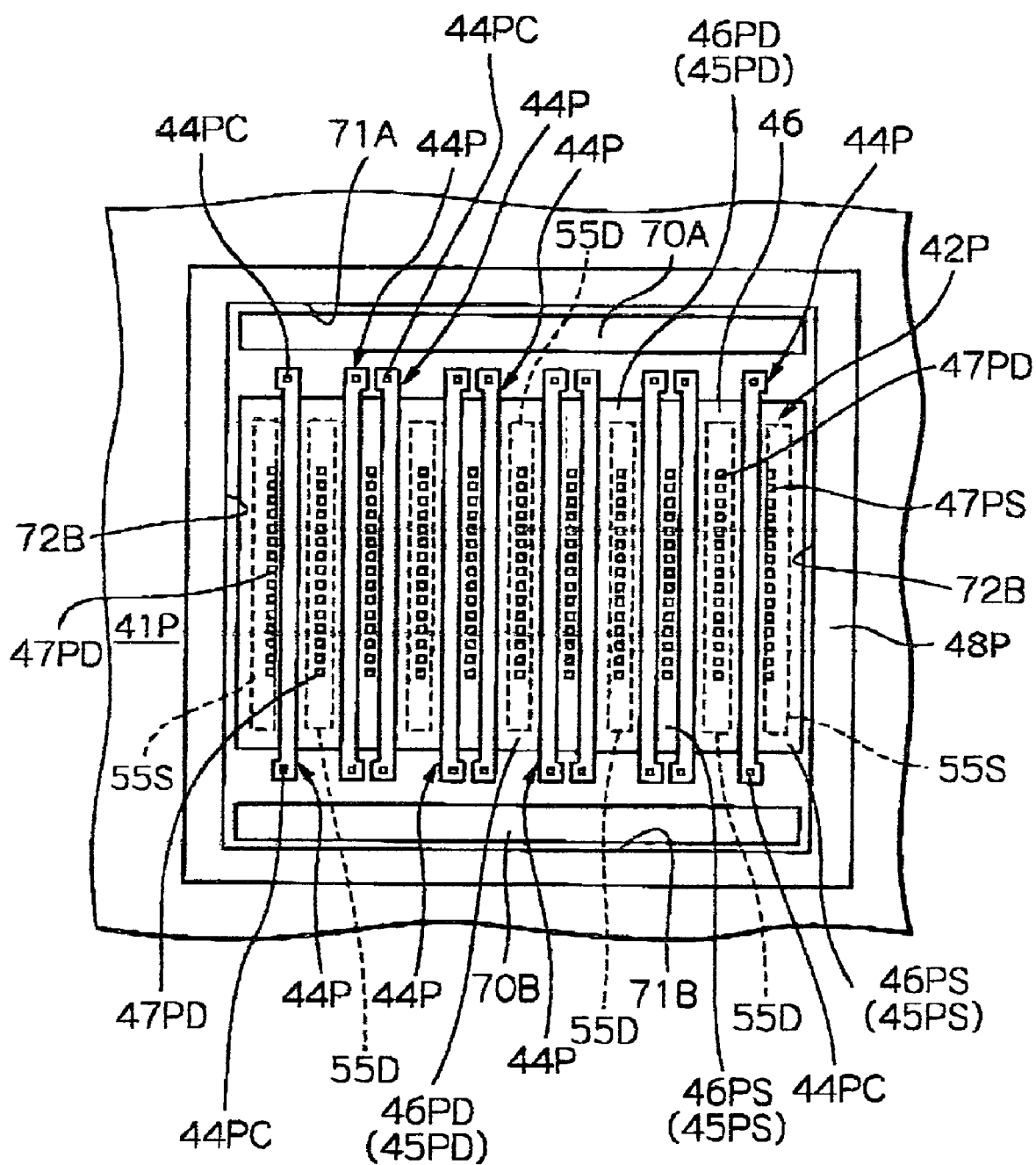
FIG. 20 is a plan view of a seventh embodiment of the MOS type semiconductor device having the ESD protection arrangement according to the present invention.

FIG. 20 shows a seventh embodiment of the MOS type semiconductor device having the ESD protection arrangement according to the present invention. Note, in FIG. 20, the features similar to those of FIG. 16 are indicated by the same references.

In FIG. 20, only an ESD protection device defined in a rectangular transistor-formation area 42P is illustrated, and an STI layer (43P) is eliminated from FIG. 20 to directly illustrate a P-type well blocking region 49 by solid lines. Also, a multi-finger structure of the ESD protection device is constituted in substantially the same manner as in the above-mentioned third embodiment shown in FIG. 16.

In this seventh embodiment, a pair of elongated P-type well blocking regions 70A and 70B are defined in a p-type well region 41P along inner opposed sides 71A and 71B of a guard-ring 48P, which are perpendicular to an extensional direction of elongated gate electrodes 44P. Namely, no P-type well blocking region is defined in the P-type well region 41P along each of the other inner opposed sides 72A and 72B of the guard-ring 48P. Instead, the other opposite sides 72A and 72B of the guard-ring 48P are close to corresponding opposite sides of the transistor-formation area 42P.

In the seventh embodiment, since there is no P-type well blocking area along the other inner opposed sides 72A and 72B of the guard-ring 48P, it is possible to decrease a substrate resistance at the transistor-formation area 42 as a whole, so that it is possible to effectively prevent occurrence of a latch-up state.

On the other hand, since an elongated P-type well blocking region 55S is defined in a P-type well region 41P beneath each of source regions 45PS, and since an elongated P-type well blocking region 55D is defined in the P-type well region 41P beneath each of source regions 45PS, a substrate resistance is increased at each of the source and drain regions 45PS and 45PD, whereby even occurrence of snapbacks in all the fingers can be ensured.

Similar to the fourth embodiment shown in FIG. 17, in this fifth embodiment, substrate resistances at the outermost fingers are smaller in comparison with those at the central fingers. Thus, when a positive surge current flows into the drain regions 45ND of the ESD protection device, snapbacks initially occur in the central fingers. Then, the occurrence of the snapbacks is shifted toward the outermost finger. Namely, the snapbacks occur in a chain-reaction manner from the central fingers toward the outermost fingers.

Of course, although a value of a substrate resistance must be optimally determined at each of the outermost fingers such that the occurrence of the snapbacks in all the fingers can be securely ensured, it is possible to easily carry out the optimal determination of the substrate resistance value by adjusting lengths of the elongated P-type well blocking regions 55S and 55D.

EIGHTH EMBODIMENT

Figure 21:
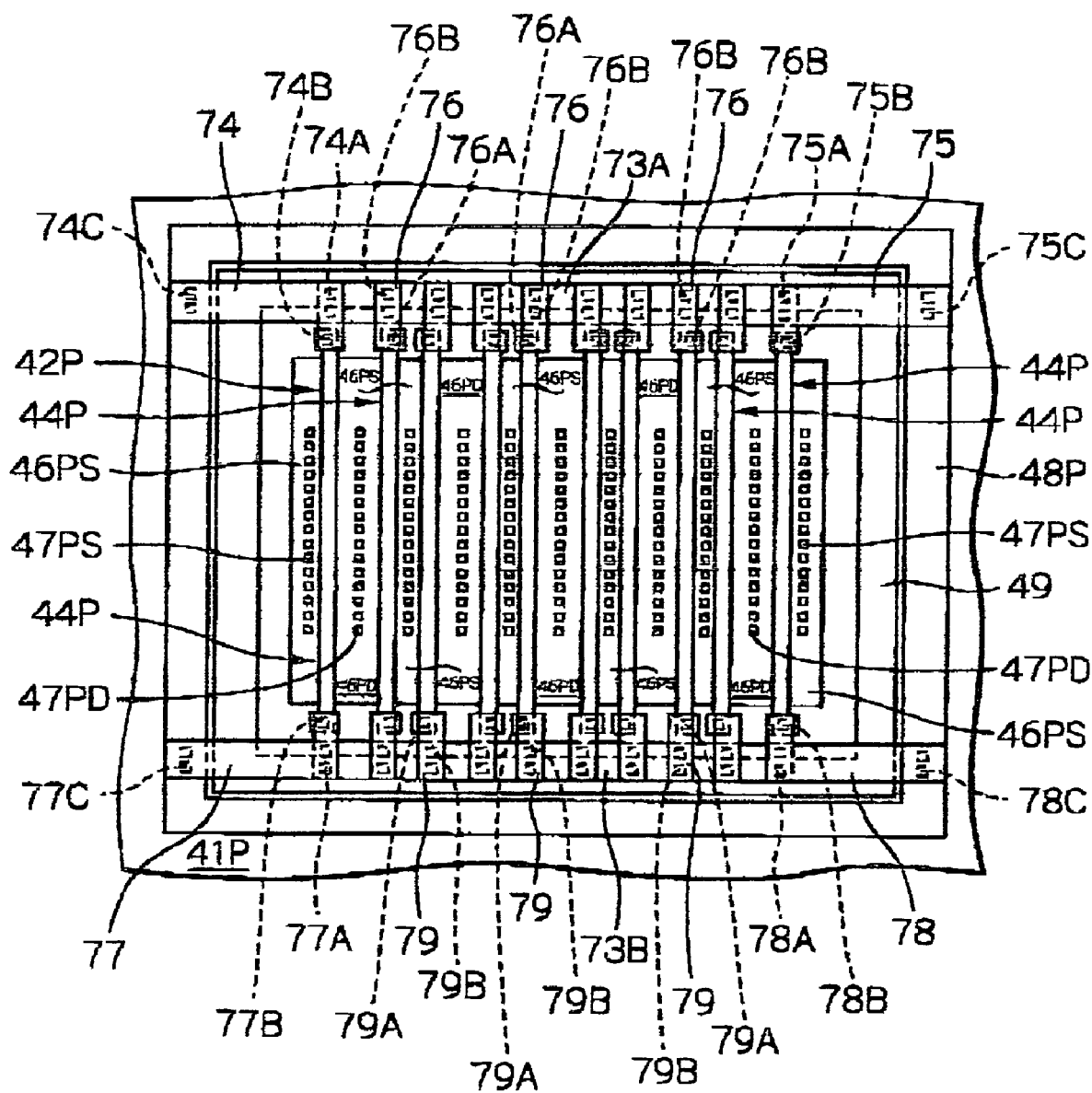
FIG. 21 is a plan view of an eighth embodiment of the MOS type semiconductor device having the ESD protection arrangement according to the present invention.

FIG. 21 shows an eighth embodiment of the MOS type semiconductor device having the ESD protection arrangement according to the present invention. Note, in FIG. 21, the features similar to those of FIG. 9 are indicated by the same references.

In FIG. 21, only an ESD protection device defined in a rectangular transistor-formation area 42P is illustrated, and an STI layer (43P) is eliminated from FIG. 21 to directly illustrate a P-type well blocking region 49 by solid lines. Also, a multi-finger structure of the ESD protection device is constituted in substantially the same manner as in the above-mentioned first embodiment shown in FIGS. 9 to 13.

In this eighth embodiment, two elongated resistor layers 73A and 73B are formed along the respective opposite sides of the transistor-formation area 42P which are perpendicular to an extensional direction of elongated gate electrodes 44P. Namely, each of the elongated resistor layers 73A and 73B is positioned on and along the boundary between the transistor-formation area 42P and the STI layer (43P) which is eliminated from FIG. 21. In short, each of the elongated resistor layers 73A and 73B is formed so as to partially overlap with both the transistor-formation area 42P and the STI layer (43P).

Each of the elongated resistor layers 73A and 73B has a length which is substantially equal to a distance between the outermost elongated gate electrodes 44P, and exhibits a resistance value falling within a range from 200Ω to 1 kΩ in a lengthwise direction. Preferably, the elongated resistor layers 73A and 73B are composed of polycrystalline silicon. In this case, it is possible to simultaneously carry out the formation of the resistor layers 73A and 73B when gate electrode layers of the elongated gate electrodes 44P are formed.

One end of the elongated resistor layer 73A is connected to a generally L-shaped conductive layer 74 through via plugs 74A. The L-shaped conductive layer 74 is connected to one end of one of the outermost elongated electrodes 44P through a via plug 74B, and is connected to a guard-ring 48P through via plugs 74C. The other end of the elongated resistor layer 73A is connected to a generally L-shaped conductive layer 75 through via plugs 75A. The L-shaped conductive layer 75 is connected to one end of the other outermost elongated electrode 44P through a via plug 75B, and is connected to a guard-ring 48P through via plugs 74C. One end of each of the remaining elongated gate electrodes 44P provided between the outermost elongated electrodes 44P is connected to a conductive layer 76 through a via plug 76A, and the conductive layer 76 is connected to the elongated resistor layer 73A through via plugs 76B.

One end of the elongated resistor layer 73B is connected to a generally L-shaped conductive layer 77 through via plugs 77A. The L-shaped conductive layer 77 is connected to the other end of the aforesaid one of the outermost elongated electrodes 44P through a via plug 77B, and is connected to the guard-ring 48P through via plugs 77C. The other end of the elongated resistor layer 73B is connected to a generally L-shaped conductive layer 78 through via plugs 78A. The L-shaped conductive layer 78 is connected to the other end of the other outermost elongated electrode 44P through a via plug 78B, and is connected to the guard-ring 48P through via plugs 78C. The other end of each of the remaining elongated gate electrodes 44P provided between the outermost elongated electrodes 44P is connected to a conductive layer 79 through a via plug 78A, and the conductive layer 79 is connected to the elongated resistor layer 73B through via plugs 79B.

Note, although not shown in FIG. 21, the MOS type semiconductor device includes a multi-layered wiring structures and the aforesaid various conductive layers and the various via plugs are formed in the multi-layer wiring structure.

With the above-mentioned arrangement, the elongated gate electrodes 44P are connected to each other through the resistor layers 73A and 73B, and then are connected to the guard-ring 48P which is grounded.

Thus, a substrate resistance between the guard-ring 48P and each of the outermost elongated gate electrodes 44P is considerably small, whereas a substrate resistance between the guard-ring 48P and each of the remaining elongated gate electrodes 44P is relatively large. Namely, a substrate resistance between the guard-ring 48P and the central elongated gate electrode 44P (which is closest to the center between the outermost elongated gate electrodes 44P) is maximum. In short, in the transistor-formation area 42P, the substrate resistance is gradually increased from the sides of the transistor-formation area 42P toward the center thereof. Also, in each of the fingers, the elongated gate electrode 44P and the drain regions (45PD) are connected to each other through a parasitic capacitance produced therebetween.

In operation, when a positive surge current flows into the drain regions (45ND) of the ESD protection device, a potential at each of the elongated gate electrodes 44P rises due to the parasitic capacitance connection between the elongated gate electrode concerned and a corresponding drain region. At this time, the potential is smallest at each of the outermost elongated gate electrodes 44P, and the potential is largest at the central elongated gate electrodes 44P which are closest to the center between the outermost elongated gate electrodes 44P. Thus, snapbacks occur in the central fingers closest to the center between the outermost elongated gate electrodes 44P, and the occurrence of the snapbacks is shifted toward the outermost fingers. Namely, the snapbacks occur in a chain-reaction manner from the central fingers toward the outermost fingers.

Of course, although the variation or distribution of the substrate resistance value must be optimally determined so that the occurrence of the snapbacks in all the fingers can be securely ensured, it is possible to easily carry out the optimal determination of the variation or distribution of the substrate resistance value by adjusting a resistance value of the elongated resistor layers or polycrystalline silicon layers 73A and 73B.

NINTH EMBODIMENT

Figure 22:
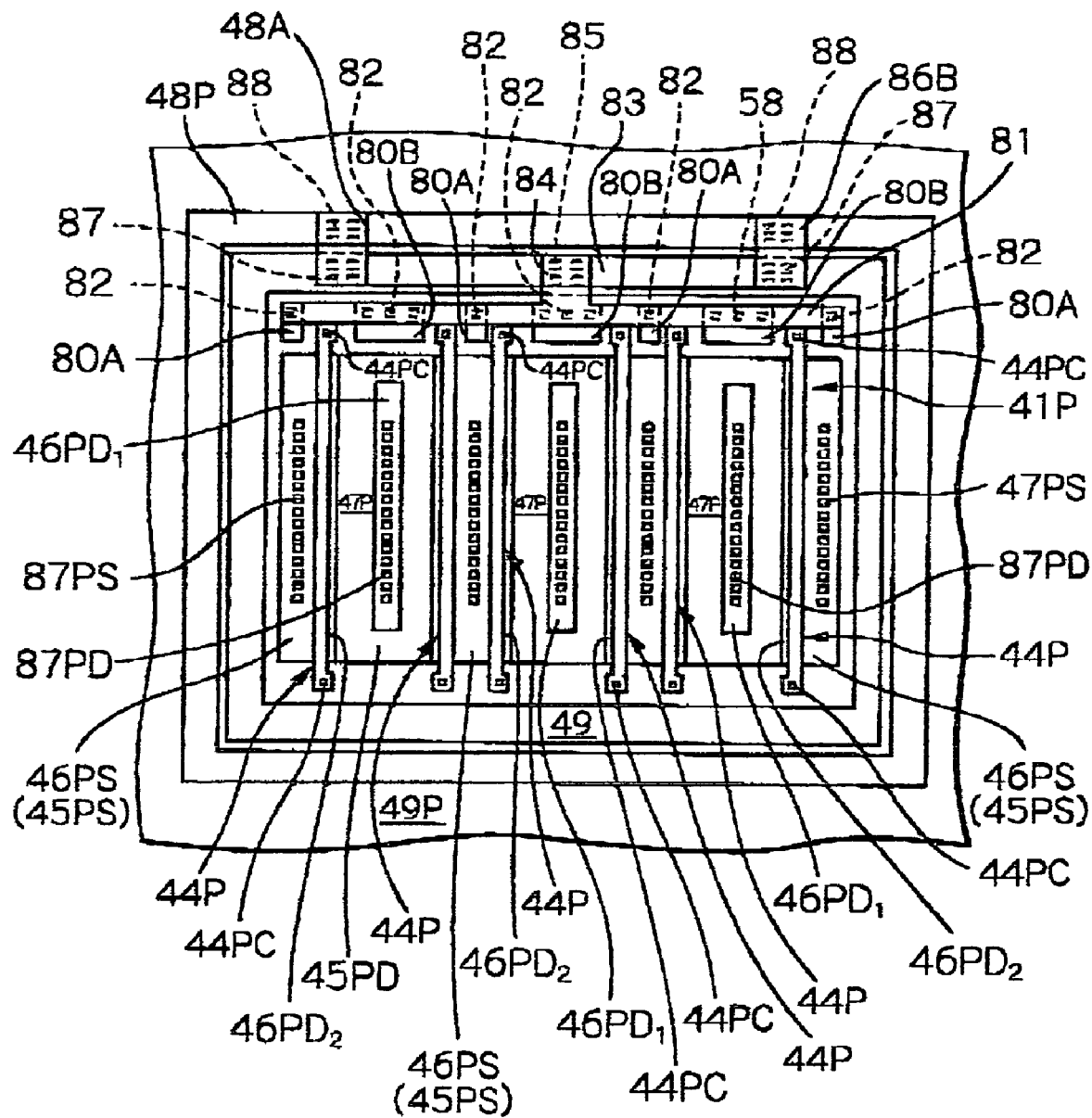
FIG. 22 is a plan view of an ninth embodiment of the MOS type semiconductor device having the ESD protection arrangement according to the present invention.

FIG. 22 shows a ninth embodiment of the MOS type semiconductor device having the ESD protection arrangement according to the present invention. Note, in FIG. 22, the features similar to those of FIG. 9 are indicated by the same references.

In FIG. 22, only an ESD protection device defined in a rectangular transistor-formation area 42P is illustrated, and an STI layer (43P) is eliminated from FIG. 22 to directly illustrate a P-type well blocking region 49 by solid lines. Also, a multi-finger structure of the ESD protection device is constituted in substantially the same manner as in the above-mentioned first embodiment shown in FIGS. 9 to 13.

In the ninth embodiment, four $P^+$-type regions 80A and three $P^+$-type regions 80B are formed in a P-type well region 41P at the transistor-formation area 42P so as to be arranged along one of opposed sides of the transistor-formation area 42P which are perpendicular to an extensional direction of the elongated gate electrodes 44P. As shown in FIG. 22, the $P^+$-type regions 80A have a smaller size than that of the $P^+$-type regions 80B, and are correspondingly arranged with respect to the source regions 45P. On the other hand, the $P^+$-type regions 80B are correspondingly arranged with the drain regions 45D. These $P^+$-type regions 80A and 80B are connected to a conductive layer 81 through via plugs 82.

A resistor layer 83 is formed on the STI layer (43P) above the side of the P-type well blocking region 49 which is close to the $P^+$-type regions 80A and 80B, and is connected to a conductive layer 84, which is integrally extended from the conductive layer 81, through via plugs 85. Also, the resistor layer 83 is connected to a pair of conductive layers 86A and 86B through via plugs 87, and these conductive layers 86A and 86B are connected to a $P^+$-type guard-ring 48P through via plugs 88. In short, the $P^+$-type regions 80A and 80B are connected to the guard-ring 48P through the intermediary of the resistor layer 83.

Note, although not shown in FIG. 22, the MOS type semiconductor device includes a multi-layered wiring structure, and the aforesaid various conductive layers and the various via plugs are formed in the multi-layer wiring structure.

Preferably, the resistor layer 83 is composed of polycrystalline silicon. In this case, it is possible to simultaneously carry out the formation of the resistor layer 83 can be carried out when gate electrode layers (44PB) of to elongated gate electrodes 44P are formed.

According to the above-mentioned first embodiment, in the ninth embodiment, substrate resistances at the outermost fingers are largest in comparison with those at the central fingers.

Thus, when a positive surge current flows into the drain regions 45ND of the ESD protection device, snapbacks initially occur in the outermost fingers. Then, the occurrence of the snapbacks is shifted toward the central fingers. Namely, the snapbacks occur in a chain-reaction manner from the outermost fingers toward the central fingers in substantially the same manner as the above-mentioned first embodiment.

According to the ninth embodiment, it is possible to easily and optimally determine a value of the substrate resistance by merely adjusting a value of the resistor layer 83, so that the occurrence of the snapbacks in all the fingers in the chain-reaction manner can be ensured.

In the above-mentioned embodiments, the P-type well blocking region 49 serves as a region having a resistance value which is larger than that of the P-type well region 41P, and a resistance value of the P-type well blocking region 49 is substantially equivalent to that of the P-type semiconductor substrate 40. The P-type well blocking region 49 may be defined as a high resistance region, such as a low density N-type region, having a resistance value which is larger than that of the P-type semiconductor substrate 40, if necessary.

The ESD protection device according to the present invention may be applied to a trigger circuit for trigging a thyristor type ESD device.

Finally, it will be understood by those skilled in the art that the foregoing description is of preferred embodiments of the device, and that various changes and modifications may be made to the present invention without departing from the spirit and scope thereof.

The invention claimed is:

1. A semiconductor device comprising:
a semiconductor substrate;
a well region formed in said semiconductor substrate;
a transistor-formation region defined in said well region;
an electrostatic discharge protection device produced in said transistor-formation region and featuring a multi-finger structure including a plurality of fingers, said fingers respectively including elongated gate electrodes arranged in parallel to each other, a plurality of first regions exhibiting a first conductivity type and a plurality of second regions exhibiting a first conductivity type being alternately arranged with respect to said elongated gate electrodes;
a guard-ring formed in said well region so as to surround said transistor-formation region;
a well blocking region formed in said well region between said transistor-formation area and said guard-ring, said well blocking region substantially but incompletely surrounding said transistor-formation area; and
a substrate resistance determination system associated with said electrostatic discharge protection device and configured to determine a substrate resistance distribution at said transistor-formation area such that snapbacks occur in all said fingers in a chain-reaction manner, and such that occurrence of a latch-up state is suppressed.

2. The semiconductor device as set forth in claim 1, wherein said well region exhibits a first conductivity type, said well blocking region exhibiting the same conductivity type as said well region.

3. The semiconductor device as set forth in claim 1, wherein said well region exhibits a first conductivity type, said well blocking region being defined as a high resistance region exhibiting a second conductivity type.

4. The semiconductor device as set forth in claim 1, wherein said transistor-formation area is formed as a rectangular area, and said well blocking region is configured such that a gap is defined beside a center of a side of said transistor-formation area which is perpendicular to an extensional direction of said elongated gate electrodes, said substrate resistance determination system including said well blocking region defining said gap.

5. The semiconductor device as set forth in claim 4, wherein each of said first regions has a first silicide layer formed thereon, and each of said second regions has a second silicide layer formed thereon, a silicide blocking region being defined in said second silicide layer.

6. The semiconductor device as set forth in claim 4, further comprising a shallow trench isolation layer that defines said transistor-formation region, said well blocking region being provided beneath said shallow trench isolation layer, said shallow trench isolation layer having a gap which is formed therein above said gap of said well blocking region, said substrate resistance determination system further including a protrusion extended from said guard-ring into the gap formed in said shallow trench isolation layer.

7. The semiconductor device as set forth in claim 6, wherein each of said first regions has a first silicide layer formed thereon, and each of said second regions has a second silicide layer formed thereon, a silicide blocking region being defined in said second silicide layer.

8. The semiconductor device as set forth in claim 1, wherein said transistor-formation area is formed as a rectangular area, said well blocking region further comprising a pair of well blocking regions, said pair of well blocking regions being configured and arranged such that two gaps are defined between said well blocking regions beside centers of opposed sides of said transistor-formation area which are perpendicular to an extensional direction of said elongated gate electrodes, such that each well blocking region comprises a portion extending along an edge of said transistor-formation area parallel to said elongated gate electrodes and two portions each extending along an edge of said transistor-formation area perpendicular to said elongated gate electrodes, said substrate resistance determination system including said pair of well blocking regions defining said gaps.

9. The semiconductor device as set forth in claim 8, further comprising two other well blocking regions, said first other well blocking region being defined in said well region beneath each of said first regions, and said second other well blocking region being defined in said well region beneath each of said second regions.

10. The semiconductor device as set forth in claim 1, further comprising a shallow trench isolation layer that defines said transistor-formation region, said well blocking region being provided beneath said shallow trench isolation layer, wherein said transistor-formation area is formed as a rectangular area, and said substrate resistance determination system includes respective two resistor resistance layers formed on said shallow trench isolation layer above respective sides of the well blocking region which are close to the outermost fingers, each of said resistor resistance layers being connected to a region formed in said well region through an impurity diffusion region formed therein, and exhibiting the first conductivity type, and being further connected to said guard-ring.

11. The semiconductor device as set forth in claim 10, wherein each of said first regions has a first silicide layer formed thereon, and each of said second regions has a second silicide layer formed thereon, a silicide blocking region being defined in said second silicide layer.

12. The semiconductor device as set forth in claim 1, wherein said transistor-formation area is formed as a rectangular area, and a plurality of well blocking regions are substituted for said well blocking region, said plurality of well blocking regions being configured and arranged such that gaps are defined beside each of opposed sides of said transistor-formation area which are in parallel to an extensional direction of said elongated gate electrodes, said substrate resistance determination system including said plurality of well blocking regions defining said gaps.

13. The semiconductor device as set forth in claim 12, further comprising two other well blocking regions, said first other well blocking region being defined in said well region beneath each of said first regions, and said second other well blocking region being defined in said well region beneath each of said second regions.

14. The semiconductor device as set forth in claim 12, wherein each of said first regions has a first silicide layer formed thereon, and each of said second regions has a second silicide layer formed thereon, a silicide blocking region being defined in said second silicide layer.

15. The semiconductor device as set forth in claim 1, wherein said transistor-formation area is formed as a rectangular area, and a pair of well blocking regions are substituted for said well blocking region, said pair of well blocking regions being arranged along opposed sides of said transistor-formation area which are perpendicular to an extensional direction of said elongated gate electrodes, said substrate resistance determination system including a plurality of first well blocking regions defined in said well region beneath said first regions, and a plurality of second well blocking regions defined in said well region beneath said second regions.

16. The semiconductor device as set forth in claim 15, wherein said guard-ring has two inner opposed sides which are close to opposed sides of said transistor-formation area which are in parallel to an extensional direction of said elongated gate electrodes.

17. The semiconductor device as set forth in claim 1, wherein said transistor-formation area is formed as a rectangular area, and said substrate resistance determination system includes respective two elongated resistor resistance layers arranged along respective opposed sides of said transistor-formation area which are perpendicular to an extensional direction of said elongated gate electrodes, each of said elongated gate electrodes being connected to one of said elongated resistor resistance layers at one end thereof, and being connected to the other elongated resistor resistance layer at the other end thereof, said elongated resistor resistance layers being connected to said guard-ring at their ends.

18. The semiconductor device as set forth in claim 17, wherein each of said first regions has a first silicide layer formed thereon, and each of said second regions has a second silicide layer formed thereon.

19. The semiconductor device as set forth in claim 1, further comprising a shallow trench isolation layer that defines said transistor-formation region, said well blocking region being provided beneath said shallow trench isolation layer, wherein said transistor-formation area is formed as a rectangular area, and said substrate resistance determination system includes a resistor layer formed on said shallow trench isolation layer above a side of the well blocking region which is perpendicular to an extensional direction of said elongated gate electrodes, said resistor layer being connected to at least one region formed in said well region and exhibiting the first conductivity type, and being further connected to said guard-ring.

20. The semiconductor device as set forth in claim 19, wherein each of said first regions has a first silicide layer formed thereon, and each of said second regions has a second silicide layer formed thereon, a silicide blocking region being defined in said second silicide layer.

* * * * *